United States Patent [19]

Okaniwa et al.

[11] Patent Number: 5,800,665
[45] Date of Patent: *Sep. 1, 1998

[54] METHOD AND APPARATUS FOR FABRICATING SEMICONDUCTOR DEVICE

[75] Inventors: Kazuhiro Okaniwa; Iwao Hayase, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 589,084

[22] Filed: Jan. 23, 1996

[30] Foreign Application Priority Data

Feb. 10, 1995 [JP] Japan ................................. 7-023039

[51] Int. Cl.⁶ .................................................... B32B 31/00
[52] U.S. Cl. ................... 156/344; 156/584; 134/5; 134/32; 134/59; 134/104.3; 134/902; 29/426.3; 29/426.5
[58] Field of Search ........................... 156/344, 584; 29/426.3, 426.4, 426.5; 134/5, 32, 59, 104.3, 137, 902

[56] References Cited

U.S. PATENT DOCUMENTS

| 4,466,852 | 8/1984 | Beltz et al. ....................... 156/344 |
| 4,675,067 | 6/1987 | Valley ............................. 156/344 X |
| 4,830,699 | 5/1989 | Burlet et al. ...................... 156/344 |
| 5,256,599 | 10/1993 | Asetta et al. ....................... 156/154 X |
| 5,427,644 | 6/1995 | Nagatsuka et al. ............... 156/584 X |

FOREIGN PATENT DOCUMENTS

| 63-248133 | 10/1988 | Japan ................................. 156/344 |
| 2-87147 | 3/1990 | Japan ................................. 156/344 |
| 6-175356 | 6/1994 | Japan ................................. 156/344 |
| 1326429 | 7/1987 | U.S.S.R. ........................... 156/344 |

*Primary Examiner*—Mark A. Osele
*Attorney, Agent, or Firm*—Leydig, Voit & Mayer, Ltd.

[57] ABSTRACT

A method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and processing the semiconductor substrate; and immersing the semiconductor substrate with the reinforcing plate in a heated solvent to melt and dissolve the adhesive, thereby separating the semiconductor substrate from the reinforcing plate. An apparatus for performing the methods includes a holder for holding the semiconductor substrate with the reinforcing plate; a container for accommodating the holder and for containing a solvent that dissolves the adhesive and a heater for heating the solvent. When the adhesive between the semiconductor substrate and the reinforcing plate is sufficiently dissolved by the solvent, the semiconductor substrate is separated from the reinforcing plate. Therefore, no force is applied to the semiconductor substrate in the direction perpendicular to the surface of the semiconductor substrate, so that unwanted damage of the semiconductor substrate, such as cracking, is avoided.

6 Claims, 18 Drawing Sheets

METHOD AND APPARATUS FOR FABRICATING SEMICONDUCTOR DEVICE

FIELD OF THE INVENTION

The present invention relates to methods and apparatus for fabricating microwave field effect transistors (hereinafter referred to as FETs), integrated circuits (hereinafter referred to as ICs), microwave monolithic integrated circuits (hereinafter referred to as MMICs), and laser diodes utilizing compound semiconductors.

BACKGROUND OF THE INVENTION

When microwave FETs, ICs, MMICs, and laser diodes are fabricated utilizing compound semiconductors, after forming these elements on a front surface of a compound semiconductor substrate, such as a GaAs substrate, a reinforcing plate is bonded to a front surface of the substrate with an adhesive and, thereafter, the substrate is ground and polished at the rear surface to reduce the thickness of the substrate. Further, in the process of forming those semiconductor elements on the semiconductor substrate, when a diameter of a semiconductor substrate that can be treated within an apparatus employed for the process is larger than a diameter of the processed semiconductor substrate, the semiconductor substrate is bonded to a reinforcing plate having a diameter that can be dealt with in the apparatus. A glass plate and wax are usually employed for the reinforcing plate and the adhesive, respectively.

After the reduction in the thickness of the substrate or after the treatment included in the process of fabricating the semiconductor elements, the semiconductor substrate must be separated from the reinforcing plate. This process is conventionally carried out as follows.

Initially, as illustrated in FIG. 20, a glass plate (reinforcing plate) 1 to which a GaAs substrate 2 (semiconductor substrate) is adhered with wax 3 (adhesive) is put on a hot plate 208 with the GaAs substrate 2 facing upward, and heated. The wax 3 is heated through the glass plate 1 and melted when the temperature of the wax exceeds 100° C. Thereafter, the GaAs substrate 2 is picked up with tweezers, whereby the substrate 2 is separated from the glass plate 1.

In this process, however, even after the wax 3 is softened and melted by the heat from the hot plate, the wax still has a considerable adhesion. Therefore, when the GaAs substrate 2 that was ground at the rear surface and has a reduced mechanical strength is separated from the glass plate 1 with tweezers, a force in the direction perpendicular to the surface of the substrate 2 is easily applied to the substrate, resulting in unwanted cracking of the substrate.

SUMMARY OF THE INVENTION

It is an object of the present invention to provide a method and an apparatus for fabricating a semiconductor device in which a semiconductor substrate adhered to a reinforcing plate can be separated from the reinforcing plate without damaging the semiconductor substrate.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and giving desired treatments for fabricating semiconductor elements to the semiconductor substrate; and immersing the semiconductor substrate with the reinforcing plate in a heated solvent to melt and dissolve the adhesive, thereby separating the semiconductor substrate from the reinforcing plate. In this method, when a stress of the semiconductor substrate itself or a stress that makes the substrate curve, which is caused by stresses of insulating films, metal films, and thin semiconductor films as constituents of the semiconductor element on the substrate, overcomes the remaining adhesion of the adhesive that is melted enough, the semiconductor substrate is separated from the reinforcing plate. Therefore, no force is applied to the semiconductor substrate in the direction perpendicular to the surface of the semiconductor substrate, so that unwanted damage of the semiconductor substrate, such as cracking, is avoided. In addition, the adhesive remaining on the surface of the semiconductor substrate after the separation is dissolved in the solvent and removed from the substrate.

According to a second aspect of the present invention, a method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and giving desired treatments for fabricating semiconductor elements to the semiconductor substrate; and dissolving the reinforcing plate with a first solvent and, thereafter, dissolving the adhesive remaining on the surface of the semiconductor substrate with a second solvent, thereby separating the semiconductor substrate from the reinforcing plate. Therefore, a semiconductor substrate from which the reinforcing plate is completely removed and on which no adhesive remains is obtained. In addition, since no force is applied to the semiconductor substrate in the direction perpendicular to the surface of the substrate, unwanted damage of the substrate, such as cracking, is avoided.

According to a third aspect of the present invention, a method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and giving desired treatments for fabricating semiconductor elements to the semiconductor substrate; and attracting and fixing the semiconductor substrate and the reinforcing plate to a first stage and a second stage, respectively, and heating and melting the adhesive using heating means included in the first and second stages; and moving the first stage and the second stage in relatively different directions in a plane parallel to the semiconductor substrate and the reinforcing plate, thereby separating the semiconductor substrate from the reinforcing plate. Therefore, the separation of the semiconductor substrate from the reinforcing plate is carried out in a short time. Further, since no force is applied to the semiconductor substrate in the direction perpendicular to the surface of the substrate, unwanted damage of the substrate, such as cracking, is avoided.

According to a fourth aspect of the present invention, a method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and giving desired treatments for fabricating semiconductor elements to the semiconductor substrate; and attracting and fixing the reinforcing plate to a stage, and heating and melting the adhesive using heating means included in the stage; and sliding the semiconductor substrate from the reinforcing plate in a plane parallel to the semiconductor substrate and the reinforcing plate using sliding means, thereby separating the semiconductor substrate from the reinforcing plate. Therefore, the separation of the semiconductor substrate from the reinforcing plate is performed in a short time. Further, since no force is applied to the semiconductor substrate in the direction perpendicular to the surface of the substrate, unwanted damage of the substrate, such as cracking, is avoided.

According to a fifth aspect of the present invention, a method of fabricating a semiconductor device includes preparing a semiconductor substrate having a surface and a mechanical strength; adhering a reinforcing plate to the surface of the semiconductor substrate with an adhesive to increase the mechanical strength of the semiconductor substrate and giving desired treatments for fabricating semiconductor elements to the semiconductor substrate; and attracting and fixing the semiconductor substrate to a stage, and heating and melting the adhesive using heating means included in the stage; and sliding the reinforcing plate from the semiconductor substrate in a plane parallel to the semiconductor substrate and the reinforcing plate using sliding means, thereby separating the reinforcing plate from the semiconductor substrate. Therefore, the separation of the reinforcing plate from the semiconductor substrate is performed in a short time. Further, since no force is applied to the semiconductor substrate in the direction perpendicular to the surface of the substrate, unwanted damage of the substrate, such as cracking, is avoided.

According to a sixth aspect of the present invention, an apparatus for fabricating a semiconductor device comprises a holder for holding a semiconductor substrate having a surface to which a reinforcing plate is adhered with an adhesive; a container accommodating the holder holding the semiconductor substrate with the reinforcing plate and containing a liquid solvent that dissolves the adhesive, wherein the semiconductor substrate with the reinforcing plate is immersed in the liquid solvent; and a heater for heating the liquid solvent. Using this apparatus, the adhesive is sufficiently melted and, when a stress of the semiconductor substrate itself or a stress that makes the substrate curve, which is caused by stresses of insulating films, metal films, and thin semiconductor films as constituents of the semiconductor element on the substrate, overcomes the remaining adhesion of the molten adhesive, the semiconductor substrate is separated from the reinforcing plate. Therefore, no force is applied to the semiconductor substrate in the direction perpendicular to the surface of the semiconductor substrate, so that unwanted damage of the semiconductor substrate, such as cracking, is avoided. In addition, the adhesive remaining on the surface of the semiconductor substrate after the separation is dissolved in the solvent and removed from the substrate.

According to a seventh aspect of the present invention, in the above-described apparatus, the holder supports the reinforcing plate to hold the semiconductor substrate with the reinforcing plate so that the surface of the substrate is parallel to a direction other than horizontal direction, and a cassette for receiving the semiconductor substrate separated from the reinforcing plate and dropped spontaneously is disposed directly under the holder. Therefore, the semiconductor substrate separated from the reinforcing plate and dropped downward is received by the cassette under the holder without special operation.

According to an eighth aspect of the present invention, in the above-described apparatus, the holder supports the reinforcing plate to hold the semiconductor substrate with the reinforcing plate, and the apparatus further includes means for sliding the semiconductor substrate immersed in the solvent from the reinforcing plate, thereby separating the semiconductor substrate from the reinforcing plate, and a cassette disposed directly under the holder and receiving the semiconductor substrate separated from the reinforcing plate and dropped downward. Therefore, even when the above-described stress of the semiconductor substrate does not yet overcome the remaining adhesion of the adhesive, the semiconductor substrate can be separated from the reinforcing plate by sliding the semiconductor substrate in a direction parallel to the surface of the substrate with the sliding means. As a result, the time required for the separation of the semiconductor substrate is reduced. Further, since no force is applied to the semiconductor substrate in the direction perpendicular to the surface of the semiconductor substrate, unwanted damage of the semiconductor substrate, such as cracking, is avoided.

According to a ninth aspect of the present invention, in the above-described apparatus, the holder supports the semiconductor substrate to hold the semiconductor substrate with the reinforcing plate so that the surface of the substrate is parallel to a direction other than horizontal direction, and a cassette for receiving the reinforcing plate separated from the semiconductor substrate and dropped downward is disposed directly under the holder. Therefore, the reinforcing plate separated from the semiconductor substrate and dropped downward is received by the cassette under the holder.

According to a tenth aspect of the present invention, in the above-described apparatus, the holder supports the semiconductor substrate to hold the semiconductor substrate with the reinforcing plate, and the apparatus further includes means for sliding the reinforcing plate immersed in the solvent from the semiconductor substrate, thereby separating the reinforcing plate from the semiconductor substrate, and a cassette disposed directly under the holder and receiving the reinforcing plate separated from the semiconductor substrate and dropped downward. Therefore, even when the above-described stress of the semiconductor substrate does not yet overcome the remaining adhesion of the adhesive, the reinforcing plate can be separated from the semiconductor substrate by sliding the reinforcing plate in a direction parallel to the surface of the substrate with the sliding means. As a result, the time required for the separation of the reinforcing plate from the semiconductor substrate is reduced. Further, since no force is applied to the semiconductor substrate in the direction perpendicular to the surface of the semiconductor substrate, unwanted damage of the semiconductor substrate, such as cracking, is avoided.

According to an eleventh aspect of the present invention, the above-described apparatus further includes a pressurizer for pressurizing the solvent to a pressure higher than atmospheric pressure. Therefore, the adhesive is easily melted and dissolved, whereby the separation of the semiconductor substrate from the reinforcing plate is facilitated. Further, the adhesive remaining on the surface of the substrate after the separation is easily dissolved and removed.

According to a twelfth aspect of the present invention, an apparatus for fabricating a semiconductor device comprises a holder for holding a semiconductor substrate having a surface to which a reinforcing plate is adhered with an adhesive; means for producing a gaseous solvent that is heated and pressurized to a pressure higher than atmospheric pressure; a container accommodating the holder holding the semiconductor substrate with the reinforcing plate and hermetically containing the gaseous solvent. Also in this apparatus, the adhesive is sufficiently melted and, when the above-described stress of the semiconductor substrate overcomes the remaining adhesion of the molten adhesive, the semiconductor substrate is separated from the reinforcing plate. Therefore, no force is applied to the semiconductor substrate in the direction perpendicular to the surface of the semiconductor substrate, so that unwanted damage of the semiconductor substrate, such as cracking, is avoided. In addition, the adhesive remaining on the surface of the semiconductor substrate after the separation is easily dissolved by the solvent and removed from the substrate.

According to a thirteenth aspect of the present invention, in the above-described apparatus, the holder supports the reinforcing plate to hold the semiconductor substrate with the reinforcing plate so that the surface of the substrate is parallel to a direction other than horizontal direction, and a cassette for receiving the semiconductor substrate separated from the reinforcing plate and dropped downward is disposed directly under the holder. Therefore, the semiconductor substrate separated from the reinforcing plate and dropped downward is received by the cassette under the holder without special operation.

According to a fourteenth aspect of the present invention, in the above-described apparatus, the holder supports the reinforcing plate to hold the semiconductor substrate with the reinforcing plate, and the apparatus further includes means for sliding the semiconductor substrate exposed to the solvent from the reinforcing plate, thereby separating the semiconductor substrate from the reinforcing plate, and a cassette disposed directly under the holder and receiving the semiconductor substrate separated from the reinforcing plate and dropped downward. Therefore, even when the above-described stress of the semiconductor substrate does not yet overcome the remaining adhesion of the adhesive, the semiconductor substrate can be separated from the reinforcing plate by sliding the semiconductor substrate in a direction parallel to the surface of the substrate with the sliding means. As a result, the time required for the separation of the semiconductor substrate is reduced. Further, since no force is applied to the semiconductor substrate in the direction perpendicular to the surface of the semiconductor substrate, unwanted damage of the semiconductor substrate, such as cracking, is avoided.

According to a fifteenth aspect of the present invention, in the above-described apparatus, the holder supports the semiconductor substrate to hold the semiconductor substrate with the reinforcing plate so that the surface of the substrate is parallel to a direction other than horizontal direction, and a cassette for receiving the reinforcing plate separated from the semiconductor substrate and dropped downward is disposed directly under the holder. Therefore, the reinforcing plate separated from the semiconductor substrate and dropped downward is received by the cassette under the holder.

According to a sixteenth aspect of the present invention, in the above-described apparatus, the holder supports the semiconductor substrate to hold the semiconductor substrate with the reinforcing plate, and the apparatus further includes means for sliding the reinforcing plate exposed to the solvent from the semiconductor substrate, thereby separating the reinforcing plate from the semiconductor substrate, and a cassette disposed directly under the holder and receiving the reinforcing plate separated from the semiconductor substrate and dropped downward. Therefore, even when the above-described stress of the semiconductor substrate does not yet overcome the remaining adhesion of the adhesive, the reinforcing plate can be separated from the semiconductor substrate by sliding the reinforcing plate in a direction parallel to the surface of the substrate with the sliding means. As a result, the time required for the separation of the reinforcing plate from the semiconductor substrate is reduced. Further, since no force is applied to the semiconductor substrate in the direction perpendicular to the surface of the semiconductor substrate, unwanted damage of the semiconductor substrate, such as cracking, is avoided.

According to a seventeenth aspect of the present invention, the above-described apparatus further includes a heater for heating the container. Therefore, reduction in the temperature of the gaseous solvent contained in the container is avoided, whereby the adhesive is melted and dissolved with high efficiency. As a result, the separation of the semiconductor substrate from the reinforcing plate and the removal of the adhesive remaining on the surface of the substrate are facilitated.

According to an eighteenth aspect of the present invention, in the above-described apparatus, the adhesive is wax and the solvent is an organic solvent. The wax is easily melted when its temperature exceeds 100° C., and the organic solvent easily dissolves the wax. Therefore, the separation of the semiconductor substrate from the reinforcing plate is facilitated. Further, removal of the wax from the semiconductor substrate is also facilitated.

According to a nineteenth aspect of the present invention, an apparatus for fabricating a semiconductor device comprises a holder for holding a semiconductor substrate having a surface to which a reinforcing plate is adhered with an adhesive, the holder supporting the reinforcing plate; a cassette for receiving the semiconductor substrate separated from the reinforcing plate and dropped downward, the cassette being disposed directly under the holder; a first container accommodating the holder and the cassette and containing a first liquid solvent that dissolves the reinforcing plate, wherein the semiconductor substrate with the reinforcing plate is immersed in the first liquid solvent; and a second container accommodating the cassette and containing a second liquid solvent that dissolves the adhesive, wherein the semiconductor substrate is immersed in the second liquid solvent. Using this apparatus, a semiconductor substrate from which the reinforcing plate is completely removed and on which no adhesive remains is obtained. Further, since no force is applied to the semiconductor substrate in the direction perpendicular to the surface of the substrate, unwanted damage of the substrate, such as cracking, is avoided. Furthermore, the semiconductor substrate after dissolution of the reinforcing plate is received by the cassette.

According to a twentieth aspect of the present invention, the apparatus further includes a first heater for heating the first container. Therefore, the first solvent is heated, whereby the reinforcing plate is easily dissolved.

According to a twenty-first aspect of the present invention, an apparatus for fabricating a semiconductor device comprises a holder for holding a semiconductor substrate having a surface to which a reinforcing plate is adhered with an adhesive, the holder supporting the reinforcing plate; a cassette for receiving the semiconductor substrate separated from the reinforcing plate and dropped downward, the cassette being disposed directly under the holder; a first container accommodating the holder and the cassette and containing a gaseous solvent that dissolves the reinforcing plate, wherein the semiconductor substrate with the reinforcing plate is exposed to the gaseous solvent; a nozzle for spraying the gaseous solvent to the reinforcing plate in the first container; and a second container accommodating the cassette and containing a liquid solvent that dissolves the adhesive, wherein the semiconductor substrate is immersed in the liquid solvent. Also in this apparatus, a semiconductor substrate from which the reinforcing plate is completely removed and on which no adhesive remains is obtained. Further, since no force is applied to the semiconductor substrate in the direction perpendicular to the surface of the substrate, unwanted damage of the substrate, such as cracking, is avoided. Furthermore, the semiconductor substrate after dissolution of the reinforcing plate is received by the cassette.

According to a twenty-second aspect of the present invention, the above-described apparatus further includes a second heater for heating the second container. Therefore, the second solvent is heated, whereby the adhesive is easily dissolved.

According to a twenty-third aspect of the present invention, an apparatus for fabricating a semiconductor device comprises a holder for holding a semiconductor substrate having a surface to which a reinforcing plate is adhered with an adhesive, the holder supporting the reinforcing plate; a cassette for receiving the semiconductor substrate separated from the reinforcing plate and dropped downward, the cassette being disposed directly under the holder; a first nozzle for spraying a first liquid solvent that dissolves the reinforcing plate to the reinforcing plate; and a second nozzle for spraying a second liquid solvent that dissolves the adhesive to the adhesive remaining on the surface of the semiconductor substrate received by the cassette. Also in this apparatus, a semiconductor substrate from which the reinforcing plate is completely removed and on which no adhesive remains is obtained. Further, since no force is applied to the semiconductor substrate in the direction perpendicular to the surface of the substrate, unwanted damage of the substrate, such as cracking, is avoided. Furthermore, the semiconductor substrate after dissolution of the reinforcing plate is received by the cassette.

According to a twenty-fourth aspect of the present invention, in the above-described apparatus, the reinforcing plate is a glass plate and the first liquid solvent is hydrofluoric acid. Since glass is easily dissolved in hydrofluoric acid, the removal of the glass plate is facilitated.

According to a twenty-fifth aspect of the present invention, in the above-described method, the adhesive is wax and the second solvent is an organic solvent. The wax is easily melted when its temperature exceeds 100° C., and the organic solvent easily dissolves the wax. Therefore, the separation of the semiconductor substrate from the reinforcing plate is facilitated. In addition, the wax is easily removed from the substrate.

According to a twenty-sixth aspect of the present invention, in the above-described apparatus, the holder comprises an upper cassette that supports the reinforcing plate to hold the semiconductor substrate with the reinforcing plate so that the surface of the substrate is parallel to a direction other than horizontal direction and that has a lower opening through which the semiconductor substrate separated from the reinforcing plate is dropped. Therefore, the semiconductor substrate with the reinforcing plate is supported by the upper cassette with high reliability, and the semiconductor substrate separated from the reinforcing plate is received by the lower cassette disposed under the upper cassette.

According to a twenty-seventh aspect of the present invention, in the above-described apparatus, the holder comprises an upper cassette that supports the semiconductor substrate to hold the semiconductor substrate with the reinforcing plate so that the surface of the substrate is parallel to a direction other than horizontal direction and that has a lower opening through which the reinforcing plate separated from the semiconductor substrate is dropped. Therefore, the semiconductor substrate with the reinforcing plate is supported by the upper cassette with high reliability, and the reinforcing plate separated from the semiconductor substrate is received by the lower cassette disposed under the upper cassette.

According to a twenty-eighth aspect of the present invention, an apparatus for fabricating a semiconductor device comprises a first stage for attracting and fixing a reinforcing plate which is adhered to a surface of a semiconductor substrate with an adhesive to increase mechanical strength of the semiconductor substrate; a second stage for attracting and fixing the semiconductor substrate; a heater for heating the reinforcing plate to melt the adhesive, included in the first stage; and means for moving the first stage and the second stage in relatively different directions in a plane parallel to the semiconductor substrate and the reinforcing plate, thereby separating the semiconductor substrate from the reinforcing plate. Using this apparatus, the semiconductor substrate is separated from the reinforcing plate in a short time by moving the semiconductor substrate and the reinforcing plate in different directions. In addition, since no force is applied to the semiconductor substrate in the direction perpendicular to the surface of the substrate, unwanted damage of the substrate, such as cracking, is avoided.

According to a twenty-ninth aspect of the present invention, an apparatus for fabricating a semiconductor device comprises a first stage for attracting and fixing a reinforcing plate which is adhered to a surface of a semiconductor substrate with an adhesive to increase mechanical strength of the semiconductor substrate; a second stage for attracting and fixing the semiconductor substrate; a heater for heating the semiconductor substrate to melt the adhesive, included in the second stage; and means for moving the first stage and the second stage in relatively different directions in a plane parallel to the semiconductor substrate and the reinforcing plate, thereby separating the semiconductor substrate from the reinforcing plate. Using this apparatus, the semiconductor substrate is separated from the reinforcing plate in a short time by moving the semiconductor substrate and the reinforcing plate in different directions. In addition, since no force is applied to the semiconductor substrate in the direction perpendicular to the surface of the substrate, unwanted damage of the substrate, such as cracking, is avoided.

According to a thirtieth aspect of the present invention, an apparatus for fabricating a semiconductor device comprises a stage for attracting and fixing a reinforcing plate which is adhered to a surface of a semiconductor substrate with an adhesive to increase mechanical strength of the semiconductor substrate; a heater for heating the reinforcing plate to melt the adhesive, included in the stage; and means for sliding the semiconductor substrate from the reinforcing plate in a plane parallel to the semiconductor substrate and the reinforcing plate. Using this apparatus, the semiconductor substrate is separated from the reinforcing plate in a short time by sliding the semiconductor substrate from the reinforcing plate. In addition, since no force is applied to the semiconductor substrate in the direction perpendicular to the surface of the substrate, unwanted damage of the substrate, such as cracking, is avoided.

According to a thirty-first aspect of the present invention, an apparatus for fabricating a semiconductor device comprises a stage for attracting and fixing a semiconductor substrate, the semiconductor substrate having a surface to which a reinforcing plate is adhered with an adhesive to increase mechanical strength of the semiconductor substrate; a heater for heating the semiconductor substrate to melt the adhesive, included in the stage; and means for sliding the reinforcing plate from the semiconductor substrate in a plane parallel to the semiconductor substrate and the reinforcing plate. Using this apparatus, the reinforcing plate is separated from the semiconductor substrate in a short time by sliding the reinforcing plate from the semiconductor substrate. In addition, since no force is applied to the semiconductor substrate in the direction perpendicular to the surface of the substrate, unwanted damage of the substrate, such as cracking, is avoided.

DETAILED DESCRIPTION OF THE PREFERRED EMBODIMENTS

[Embodiment 1]

Figure 1:
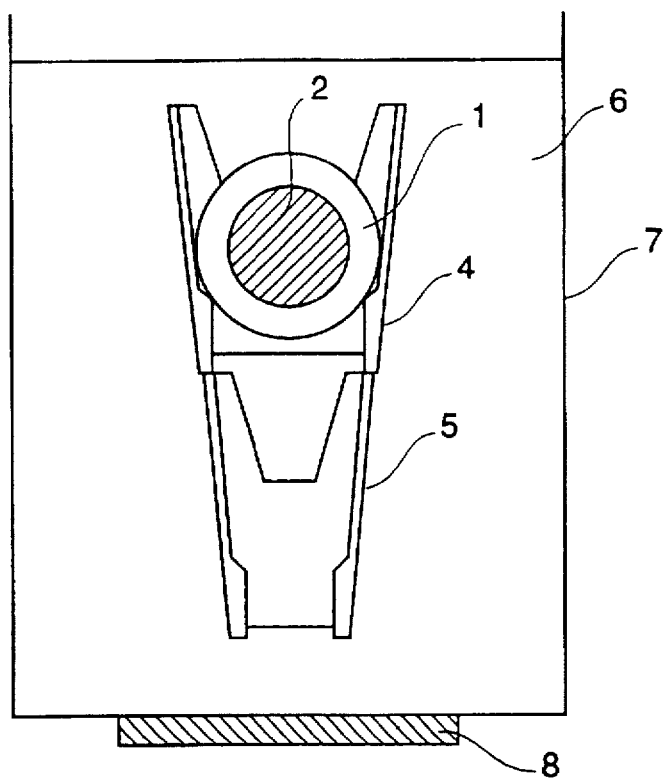
FIGS. 1(a)–1(b) are schematic diagrams illustrating a method and an apparatus for fabricating a semiconductor device in accordance with a first embodiment of the present invention.
Figure 1:
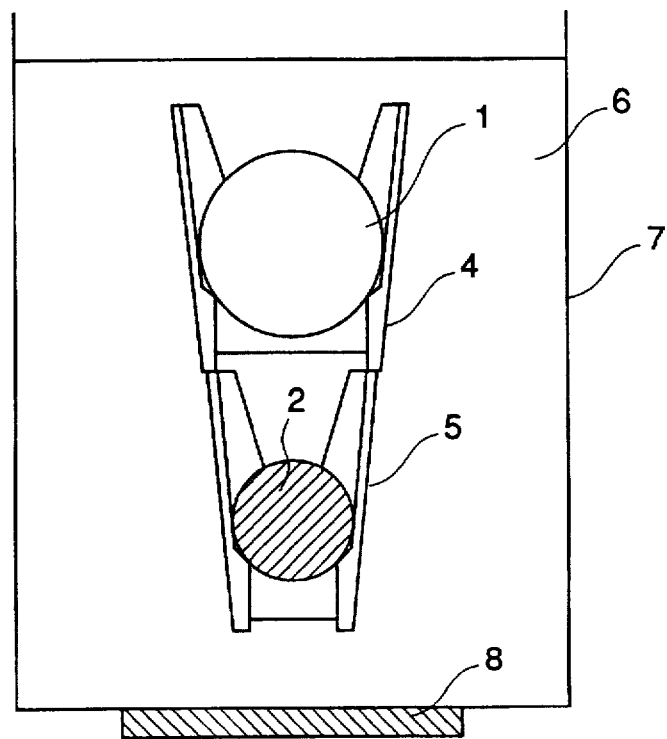

FIGS. 1(a) and 1(b) are schematic diagrams for explaining a method and an apparatus for fabricating a semiconductor device in accordance with a first embodiment of the present invention. In the figures, reference numeral 2 designates a GaAs substrate and reference numeral 1 designates a glass plate for reinforcing the GaAs substrate 2. The glass plate 1 is adhered to the GaAs substrate 2 with wax 3 (not shown).

The apparatus according to this first embodiment comprises an upper cassette 4 for holding the GaAs substrate 2 with the glass plate 1 by supporting the glass plate 1, a substrate cassette 5 for receiving the GaAs substrate 2 and disposed directly under the upper cassette 4, a container 7 containing an organic solvent 6 that dissolves the wax, and a heater 8 for heating the container 7. The organic solvent 6 includes naphtha RS its main ingredient.

A description is given of the fabricating method using the above-described apparatus.

Initially, as illustrated in FIG. 1(a), the GaAs substrate 2 to which the glass plate 1 is adhered with wax is set in the upper cassette 4 so that the surface of the substrate 2 is parallel to the vertical direction. Then, the GaAs substrate 2 with the glass plate 1 is immersed in the organic solvent 6 that is contained in the container 7 and heated to about 100°

C. by the heater 8. Generally, the wax is softened and melted by half-day immersion. When a stress of the GaAs substrate itself or a stress that makes the GaAs substrate 2 curve, which is caused by stresses of insulating films, metal films, and thin semiconductor films as constituents of a semiconductor device on the GaAs substrate, overcomes the remaining adhesion of the wax, the GaAs substrate 2 is separated from the glass plate, dropped by gravity, and received by the substrate cassette 5, as shown in FIG. 1(b). The upper cassette 4 supporting the glass plate 1 has an opening at the lower part, and the GaAs substrate 2 is dropped through the opening and received by the substrate cassette 5. The wax adhered to the GaAs substrate 2 is dissolved in the organic solvent and removed from the substrate.

In the above-described method, when the wax is dissolved and melted in the heated organic solvent 6, the GaAs substrate 2 is separated from the glass plate, dropped from the upper cassette 4 by gravity, and received by the substrate cassette 5. Since this process does not include separating the GaAs substrate from the glass plate by applying a force directly to the GaAs substrate with tweezers as in the prior art method, no force is applied to the GaAs substrate in the perpendicular to the surface of the substrate, whereby unwanted damage of the GaAs substrate, such as cracking, is avoided. Simultaneously, the wax attached to the GaAs substrate 2 is dissolved in the organic solvent 6 and removed from the GaAs substrate 2. Further, since the GaAs substrate 2 dropped from the upper cassette 4 is received by the substrate cassette 5 located directly under the upper cassette 4, the separation of the GaAs substrate 2 from the glass plate 1 and the subsequent receiving of the separated GaAs substrate 2 are carried out without special operation.

Although the surface of the GaAs substrate 2 set in the upper cassette 4 is maintained parallel to the vertical direction, it may be maintained in any direction except the horizontal direction. Also in this case, the GaAs substrate 2 is separated from the glass plate 1 by free-fall and dropped toward the substrate cassette 5 by gravity.

[Embodiment 2]

Figure 2:
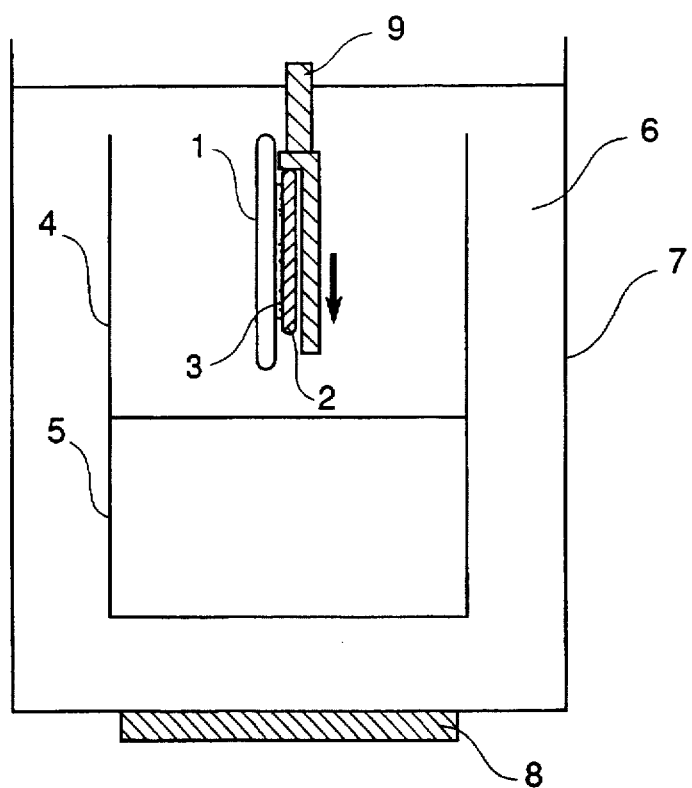
FIGS. 2(a)–2(b) are schematic diagrams illustrating a method and an apparatus for fabricating a semiconductor device in accordance with a second embodiment of the present invention.
Figure 2:
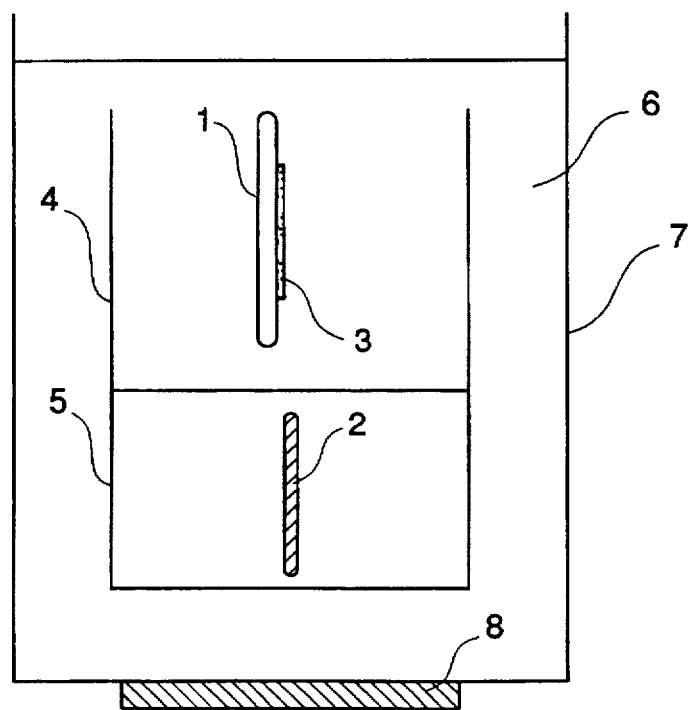

FIGS. 2(a) and 2(b) are schematic diagrams for explaining a method and an apparatus for fabricating a semiconductor device in accordance with a second embodiment of the present invention. In these figures, the same reference numerals as those shown in FIGS. 1(a) and 1(b) designate the same or corresponding parts.

The apparatus according to this second embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, a container 7 containing an organic solvent 6 that dissolves wax 3, a heater 8 for heating the container 7, and a sliding jig 9 for sliding the GaAs substrate 2 downward.

A description is given of the fabricating method using the above-described apparatus.

Initially, as in the above-described first embodiment, a GaAs substrate 2 to which a glass plate 1 is adhered with wax 3 is set in the upper cassette 4 so that the surface of the substrate is parallel to the vertical direction. Then, the GaAs substrate 2 with the glass plate 1 is immersed in the organic solvent 6 that is contained in the container 7 and heated to about 100° C. by the heater 8. When the wax 3 is softened to some extent, a downward force is applied to the GaAs substrate 2 using the sliding jig 9 as shown in FIG. 2(a), to slide the GaAs substrate 2 downward. The sliding direction is shown by an arrow in FIG. 2(a). The sliding direction is parallel to the surface of the GaAs substrate 2. In this way, the GaAs substrate 2 is separated from the glass plate 1, dropped by gravity, and received by the substrate cassette 5 as shown in FIG. 2(b). During the processing, the wax attached to the GaAs substrate 2 is dissolved in the organic solvent 6 and completely removed from the substrate.

In the above-described method, it is not necessary to immerse the GaAs substrate 2 with the glass plate 1 in the organic solvent 6 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the GaAs substrate 2 is separated from the glass plate 1 by forcibly sliding the GaAs substrate 2 downward using the sliding jig 9. Since the GaAs substrate 2 slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is completely removed from the substrate. Furthermore, since the GaAs substrate 2 is forcibly moved, the time required for the separation of the GaAs substrate 2 from the glass plate 1 is reduced compared with the method according to the first embodiment.

Although the surface of the GaAs substrate 2 set in the upper cassette 4 is maintained parallel to the vertical direction, it may be maintained in any directions. That is, even when the surface of the GaAs substrate 2 is not in the vertical direction, it is possible to drop the GaAs substrate 2 toward the substrate cassette 5 by gravity after sliding the substrate along the surface thereof using the sliding jig 9.

[Embodiment 3]

Figure 3:
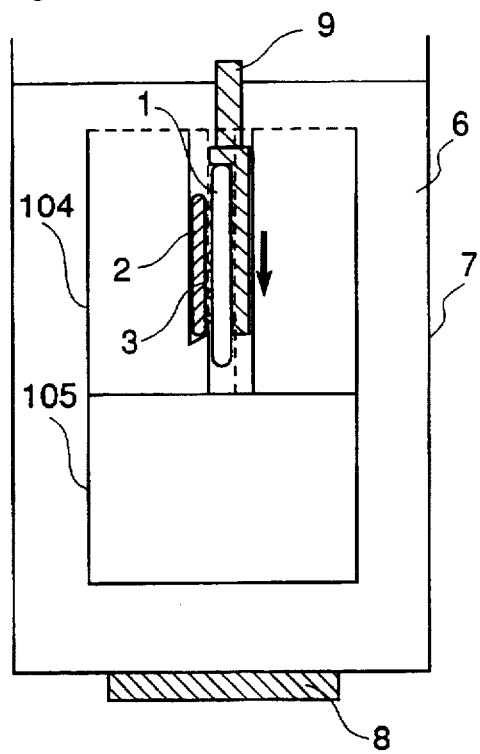
FIGS. 3(a)–3(d) are schematic diagrams illustrating a method and an apparatus for fabricating a semiconductor device in accordance with a third embodiment of the present invention.
Figure 3:
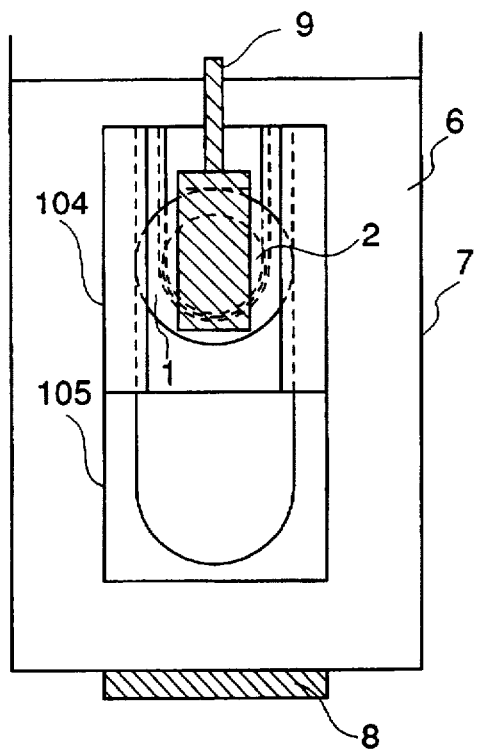
Figure 3:
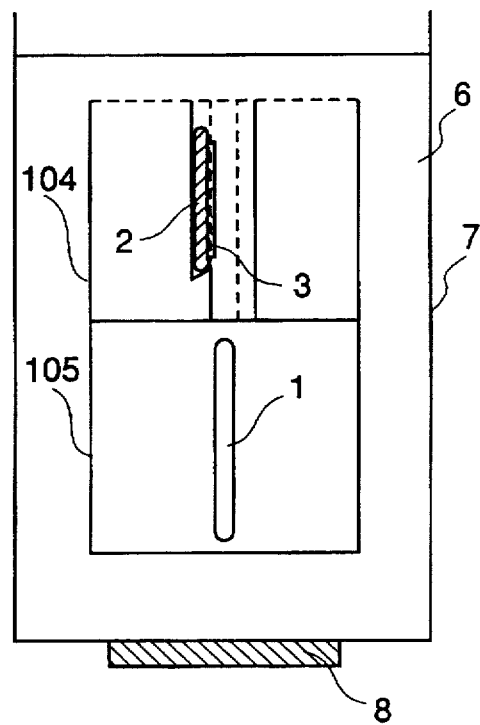
Figure 3:
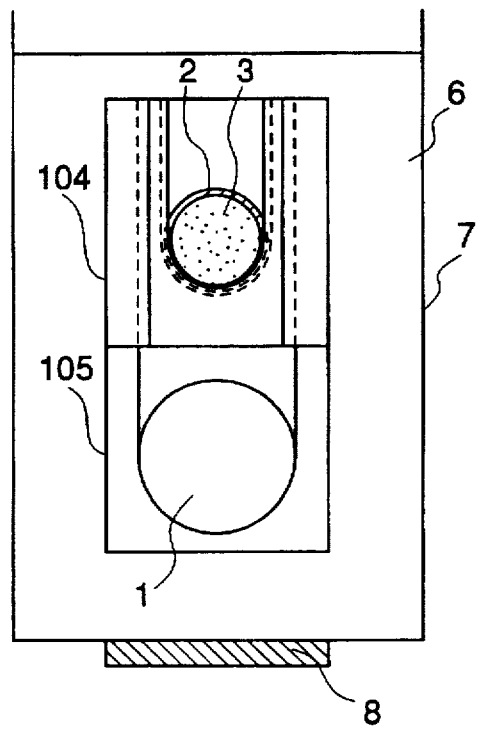

FIGS. 3(a)–3(d) are schematic diagrams for explaining a method and an apparatus for fabricating a semiconductor device in accordance with a third embodiment of the present invention. FIGS. 3(a) and 3(c) are cross-sectional views of the apparatus taken along a plane perpendicular to the glass plate and the GaAs substrate, and FIGS. 3(b) and 3(d) are cross-sectional views of the apparatus taken along a plane parallel to the glass plate and the GaAs substrate. In these figures, the same reference numerals as those in FIGS. 1(a) and 1(b) designate the same or corresponding parts.

The apparatus according to this third embodiment of the invention comprises an upper cassette 104 for holding a GaAs substrate 2 with a glass plate 1 by supporting the GaAs substrate 2, a lower cassette 105 for receiving the glass plate 1 and disposed directly under the upper cassette 104, a container 7 containing an organic solvent 6 that dissolves wax 3, a heater 8 for heating the container 7, and a sliding jig 9 for sliding the glass plate 1 downward. As shown in FIG. 3(a), the substrate supporting upper cassette 104 has an upper opening through which the glass plate 1 adhered to the GaAs substrate 2 is inserted and a lower opening through which only the glass plate 1 passes. Since a portion of the upper cassette 104 contacting the periphery of the GaAs substrate 2 is inclined, the GaAs substrate 2 is supported at this portion and, furthermore, the GaAs substrate 2 separated from the glass plate 1 is left on this portion of the upper cassette 104 with high reliability.

A description is given of the fabricating method using the above-described apparatus.

Initially, a GaAs substrate 2 to which a glass plate 1 is adhered with wax 3 is set in the upper cassette 104 so that the GaAs substrate 2 is disposed on the inclined portion of the cassette 104 and the surface of the substrate is parallel to the vertical direction. Then, the GaAs substrate 2 with the glass plate 1 is immersed in the organic solvent 6 that is contained in the container 7 and heated to about 100° C. by the heater 8. When the wax 3 is softened to some extent, a downward force is applied to the glass plate 1 using the sliding jig 9 as shown in FIGS. 3(a) and 3(b), thereby to slide the glass plate 1 downward as shown by an arrow in FIG. 3(a). The sliding direction is parallel to the surface of the GaAs substrate 2. In this way, the glass plate 1 is separated from the GaAs substrate 2, dropped by gravity through the lower opening of the upper cassette 104, and received by the lower cassette 105 as shown in FIGS. 3(c) and 3(d). During the processing, the wax attached to the GaAs substrate 2 is dissolved in the organic solvent 6 and completely removed from the substrate.

In the above-described method, it is not necessary to immerse the GaAs substrate 2 with the glass plate 1 in the organic solvent 6 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the glass plate 1 is separated from the GaAs substrate 2 by forcibly sliding the glass plate 1 downward using the sliding jig 9. Since the glass plate 1 is slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is dissolved in the organic solvent 6 and completely removed from the substrate 2. Furthermore, since the glass plate 1 is forcibly moved, the time required for the separation of the GaAs substrate 2 from the glass plate 1 is reduced compared with the method according to the first embodiment.

Although the surface of the GaAs substrate 2 set in the upper cassette 104 is maintained parallel to the vertical direction, it may be maintained in any direction. That is, even when the surface of the GaAs substrate 2 is not in the vertical direction, it is possible to drop the glass plate 1 toward the lower cassette 105 by gravity after sliding the glass plate along the surface of the GaAs substrate using the sliding jig 9.

[Embodiment 4]

Figure 4:
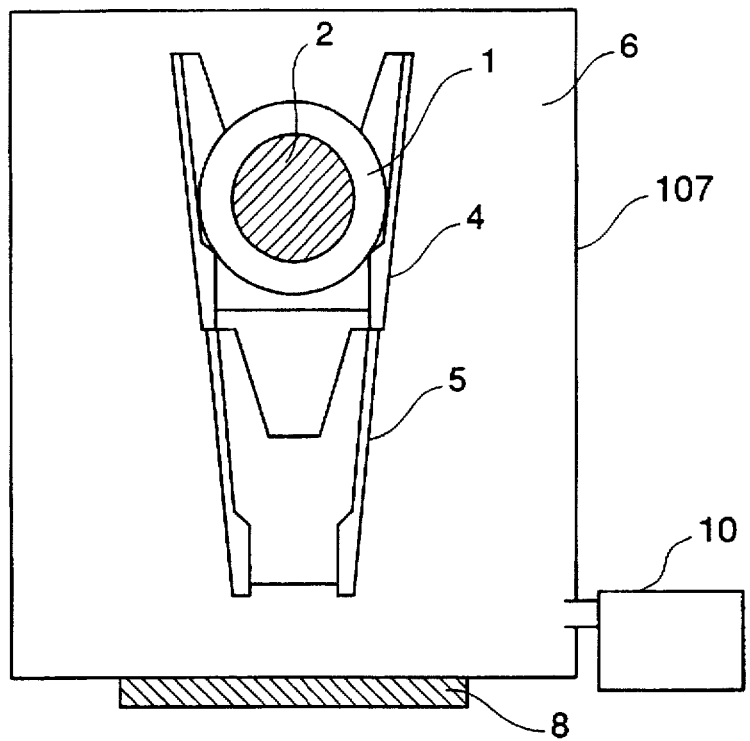
FIGS. 4(a)–4(b) are schematic diagrams illustrating a method and an apparatus for fabricating a semiconductor device in accordance with a fourth embodiment of the present invention.
Figure 4:
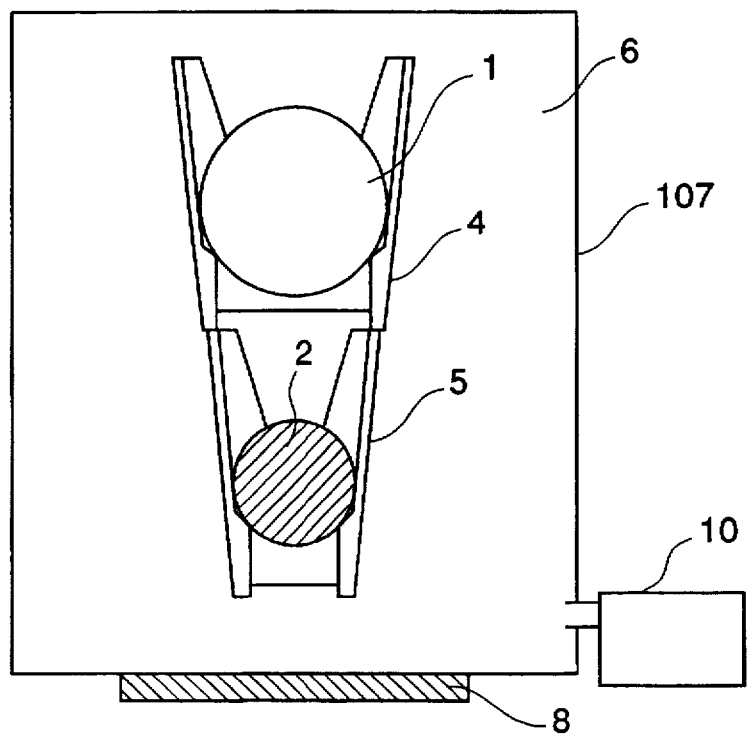

FIGS. 4(a) and 4(b) are schematic diagrams for explaining a method and an apparatus for fabricating a semiconductor device in accordance with a fourth embodiment of the present invention. In these figures, the same reference numerals as those in FIGS. 1(a) and 1(b) designate the same or corresponding parts.

The apparatus according to this fourth embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, an airtight container 107 containing an organic solvent 6 that dissolves wax, a heater 8 for heating the airtight container 107, and a pressure pump 10 for pressurizing the organic solvent 6 to a pressure higher than atmospheric pressure.

A description is given of the fabricating method using the above-described apparatus.

Initially, as illustrated in FIG. 4(a), a GaAs substrate 2 to which a glass plate 1 is adhered with wax is set in the upper cassette 4 so that the surface of the substrate 2 is parallel to the vertical direction. Then, the GaAs substrate 2 with the glass plate 1 is immersed in the organic solvent 6 that is contained in the airtight container 107, heated to about 100° C. with the heater 8, and pressurized to a pressure higher than atmospheric pressure with the pressure pump 10. The wax connecting the GaAs substrate 2 and the glass plate 1 is softened and dissolved in the organic solvent 6. When a stress of the GaAs substrate itself or a stress that makes the GaAs substrate 2 curve, which is caused by stresses of insulating films, metal films, and thin semiconductor films as constituents of a semiconductor device on the GaAs substrate, overcomes the remaining adhesion of the wax, the GaAs substrate 2 is separated from the glass plate 1, dropped by gravity, and received by the substrate cassette 5, as shown in FIG. 4(b). The upper cassette 4 supporting the glass plate 1 has an opening at the lower part, and the GaAs substrate 2 is dropped through the opening and received by the substrate cassette 5. The wax adhered to the GaAs substrate 2 is dissolved in the organic solvent and removed from the substrate.

In the above-described method, when the wax is dissolved and melted in the heated and pressurized organic solvent 6, the GaAs substrate 2 is separated from the glass plate 1 by free-fall, dropped from the upper cassette 4 by gravity, and received by the substrate cassette 5. Since this process does not include separating the GaAs substrate from the glass plate by applying a force directly to the GaAs substrate with tweezers as in the prior art method, no force is applied to the GaAs substrate perpendicular to the surface of the substrate, whereby unwanted damage of the GaAs substrate, such as cracking, is avoided. Simultaneously, the wax attached to the GaAs substrate 2 is dissolved in the organic solvent 6 and removed from the GaAs substrate 2. Further, since the organic solvent is pressurized to a pressure higher than atmospheric pressure, the separation of the GaAs substrate 2 from the glass plate 1 and the removal of the wax attached to the GaAs substrate 2 are facilitated compared with the method according to the first embodiment.

Although the surface of the GaAs substrate 2 set in the upper cassette 4 is maintained parallel to the vertical direction, it may be maintained in any direction except the horizontal direction. Also in this case, the GaAs substrate 2 is separated from the glass plate 1 and dropped toward the substrate cassette 5 by gravity.

[Embodiment 5]

Figure 5:
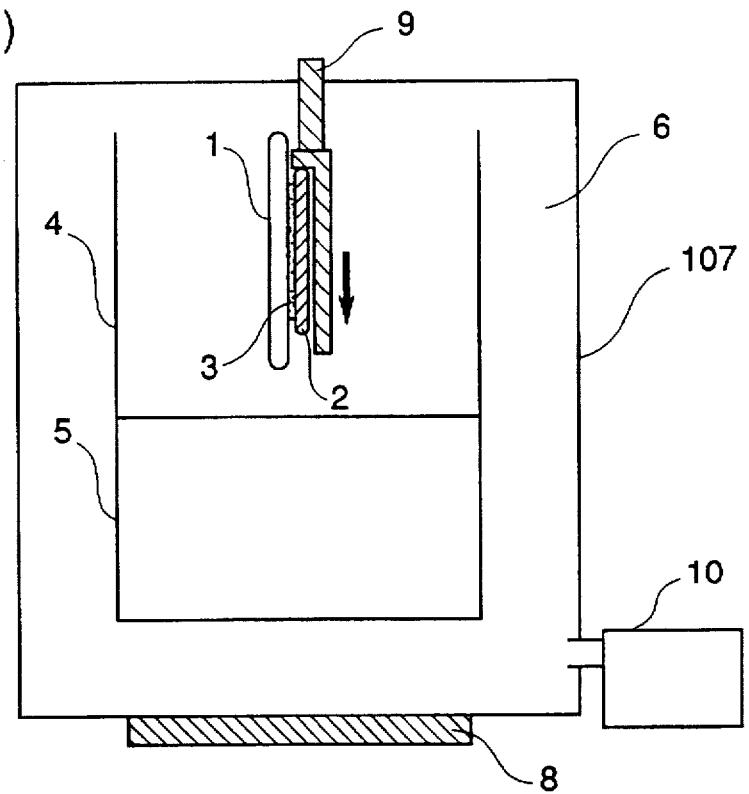
FIGS. 5(a)–5(b) are schematic diagrams illustrating a method and an apparatus for fabricating a semiconductor device in accordance with a fifth embodiment of the present invention.
Figure 5:
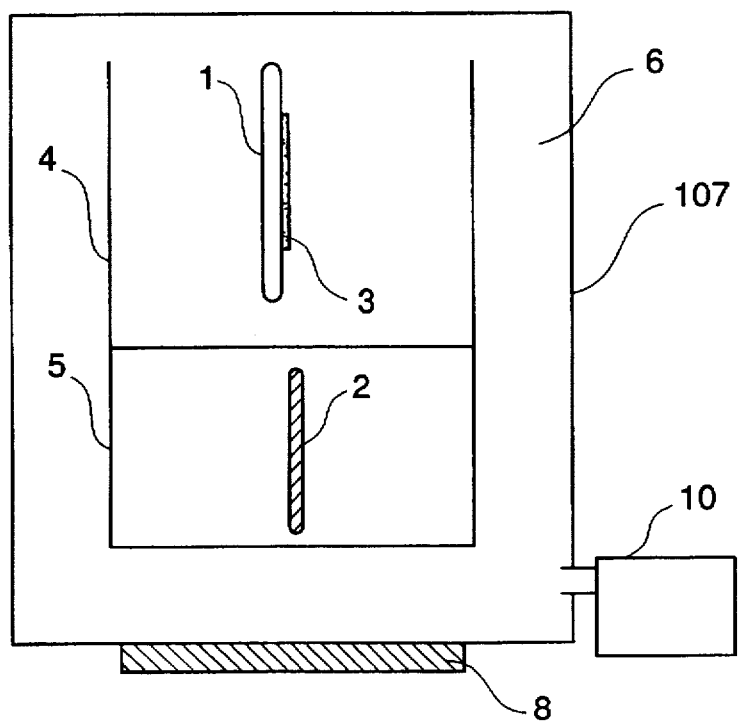

FIGS. 5(a) and 5(b) are schematic diagrams for explaining a method and an apparatus for fabricating a semiconductor device in accordance with a fifth embodiment of the present invention. In these figures, the same reference numerals as those in FIGS. 2(a)–2(b) and 4(a)–4(b) designate the same or corresponding parts.

The apparatus according to this fifth embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, an airtight container 107 containing an organic solvent 6 that dissolves wax 3, a heater 8 for heating the airtight container 107, a sliding jig 9 for sliding the GaAs substrate 2 downward, and a pressure pump 10 for pressurizing the organic solvent 6 to a pressure higher than atmospheric pressure.

A description is given of the fabricating method using the above-described apparatus.

Initially, a GaAs substrate 2 to which a glass plate 1 is adhered with wax is set in the upper cassette 4 so that the surface of the substrate 2 is parallel to the vertical direction. Then, the GaAs substrate 2 with the glass plate 1 is immersed in the organic solvent 6 that is contained in the airtight container 107, heated to about 100° C. with the heater 8, and pressurized to a pressure higher than atmospheric pressure with the pressure pump 10. When the wax 3 is softened to some extent, a downward force is applied to the GaAs substrate 2 using the sliding jig 9 as shown in FIG. 5(a), thereby to slide the GaAs substrate 2 downward. The sliding direction is parallel to the surface of the GaAs substrate 2. In this way, the GaAs substrate 2 is separated from the glass plate 1, dropped by gravity, and received by the substrate cassette 5 as shown in FIG. 5(b). During the processing, the wax attached to the GaAs substrate 2 is dissolved in the organic solvent 6 and completely removed from the substrate.

In the above-described method, it is not necessary to immerse the GaAs substrate 2 with the glass plate 1 in the organic solvent 6 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the GaAs substrate 2 is separated from the glass plate 1 by forcibly sliding the GaAs substrate 2 downward using the sliding jig 9. Since the GaAs substrate 2 is slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is completely removed from the substrate. Further, since the GaAs substrate 2 is forcibly moved, the time required for the separation of the GaAs substrate 2 from the glass plate 1 is reduced compared with the method according to the fourth embodiment of the invention. Furthermore, since the organic solvent is pressurized to a pressure higher than atmospheric pressure, the separation of the GaAs substrate 2 from the glass plate 1 and the removal of the wax attached to the GaAs substrate 2 are facilitated compared with the method according to the second embodiment of the invention.

Although the surface of the GaAs substrate 2 set in the upper cassette 4 is maintained parallel to the vertical direction, it may be maintained in any direction. That is, even when the surface of the GaAs substrate 2 is not in the vertical direction, it is possible to drop the GaAs substrate 2 toward the substrate cassette 5 by gravity after sliding the substrate along the surface thereof using the sliding jig 9.

[Embodiment 6]

Figure 6:
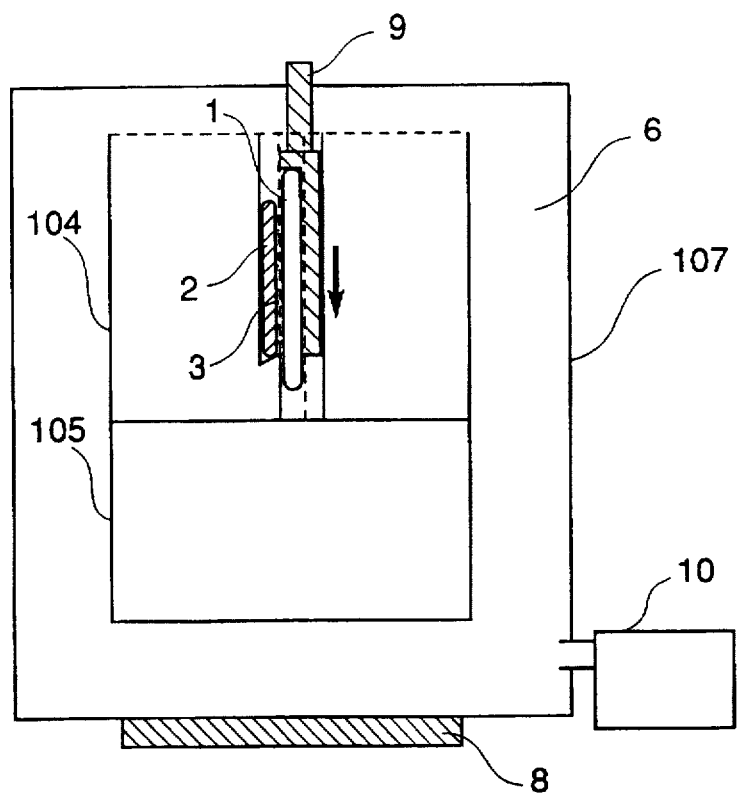
FIGS. 6(a)–6(b) are schematic diagrams illustrating a method and an apparatus for fabricating a semiconductor device in accordance with a sixth embodiment of the present invention.
Figure 6:
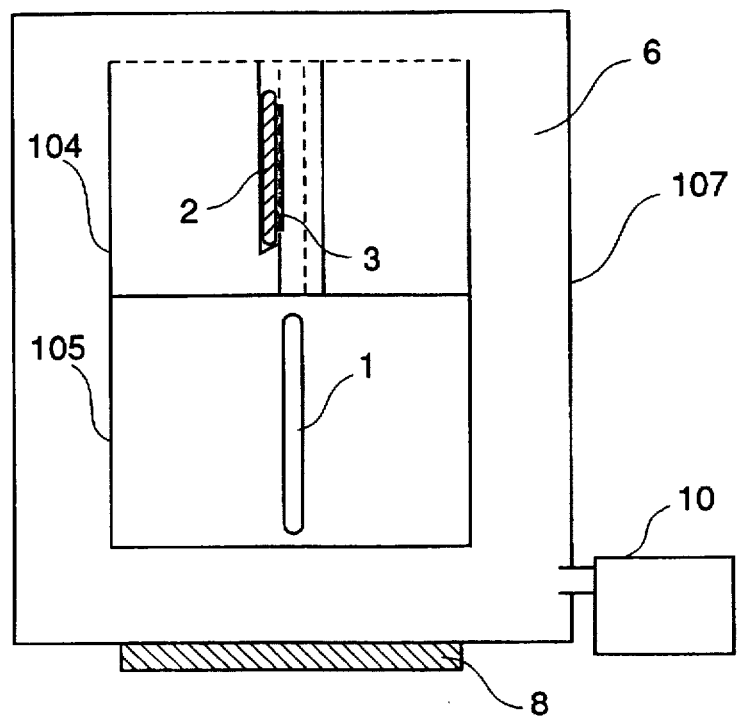

FIGS. 6(a) and 6(b) are schematic diagrams for explaining a method and an apparatus in accordance with a sixth embodiment of the present invention. In these figures, the same reference numerals as those in FIGS. 3(a)–3(d) and 4(a)–4(d) designate the same or corresponding parts.

The apparatus according to this sixth embodiment comprises an upper cassette 104 for holding a GaAs substrate 2 with a glass plate 1 by supporting the GaAs substrate 2, a lower cassette 105 for receiving the glass plate 1 and disposed directly under the upper cassette 104, an airtight container 107 containing an organic solvent 6 that dissolves wax 3, a heater 8 for heating the container 7, a sliding jig 9 for sliding the glass plate 1 downward, and a pressure pump 10 for pressurizing the organic solvent 6 to a pressure higher than atmospheric pressure. The structure of the substrate supporting upper cassette 104 is the same as that described in the third embodiment.

A description is given of the fabricating method using the above-described apparatus.

Initially, a GaAs substrate 2 to which a glass plate 1 is adhered with wax 3 is set in the upper cassette 104 so that the GaAs substrate 2 is disposed on the inclined portion of the cassette 104 and the surface of the substrate is parallel to the vertical direction. Then, the GaAs substrate 2 with the glass plate 1 is immersed in the organic solvent 6 that is contained in the airtight container 107, heated to about 100° C. with the heater 8, and pressurized to a pressure higher than atmospheric pressure with the pressure pump 10. When the wax 3 is softened to some extent, a downward force is applied to the glass plate 1 using the sliding jig 9 as shown in FIG. 6(a), thereby sliding the glass plate 1 downward. The sliding direction is parallel to the surface of the GaAs substrate 2. In this way, the glass plate 1 is separated from the GaAs substrate 2, dropped by gravity through the lower opening of the upper cassette 104, and received by the lower cassette 105 as shown in FIG. 6(b). During the processing, the wax attached to the GaAs substrate 2 is dissolved in the organic solvent 6 and completely removed from the substrate.

In the above-described method, it is not necessary to immerse the GaAs substrate 2 with the glass plate 1 in the organic solvent 6 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the glass plate 1 is separated from the GaAs substrate 2 by forcibly sliding the glass plate 1 downward using the sliding jig 9. Since the glass plate 1 is slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is dissolved in the organic solvent 6 and completely removed from the substrate. Further, since the glass plate 1 is forcibly moved, the time required for the separation of the GaAs substrate 2 from the glass plate 1 is reduced compared with the method according to the fourth embodiment. Furthermore, since the organic solvent is pressurized to a pressure higher than atmospheric pressure, the separation of the GaAs substrate 2 from the glass plate 1 and the removal of the wax attached to the GaAs substrate 2 are facilitated compared with the method according to the third embodiment of the invention.

Although the surface of the GaAs substrate 2 set in the upper cassette 104 is maintained parallel to the vertical direction, it may be maintained in any direction. That is, even when the surface of the GaAs substrate 2 is not in the vertical direction, it is possible to drop the glass plate 1 toward the lower cassette 105 by gravity after sliding the glass plate along the surface of the GaAs substrate using the sliding jig 9.

[Embodiment 7]

Figure 7:
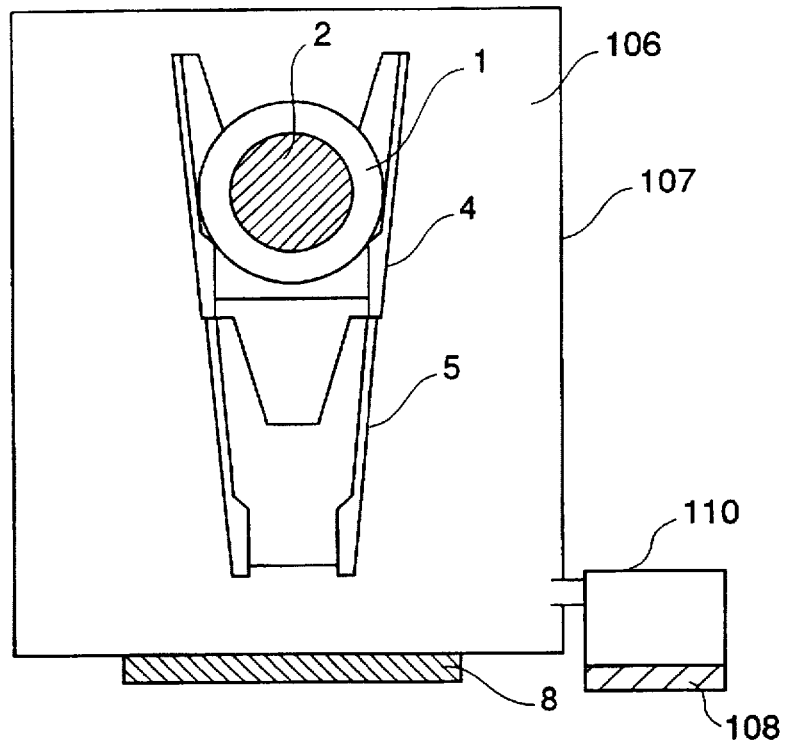
FIGS. 7(a)–7(b) are schematic diagrams illustrating a method and an apparatus for fabricating a semiconductor device in accordance with a seventh embodiment of the present invention.
Figure 7:
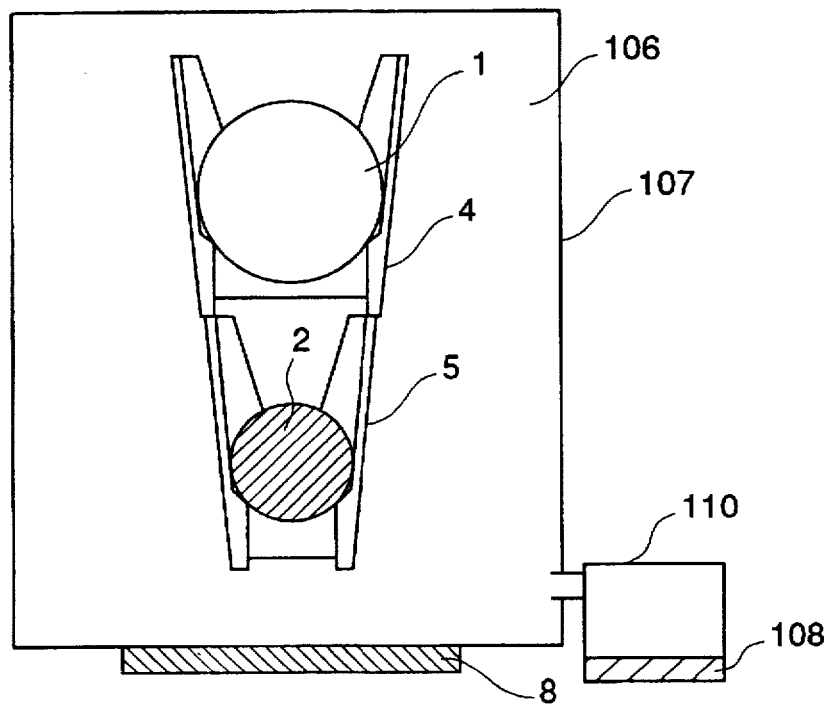

FIGS. 7(a) and 7(b) are schematic diagrams for explaining a method and an apparatus for fabricating a semiconductor device in accordance with a seventh embodiment of the present invention. In these figures, the same reference numerals as those in FIGS. 1(a) and 1(b) designate the same or corresponding parts.

The apparatus according to this seventh embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, an airtight container 107 containing a gaseous organic solvent (organic solvent vapor) 106 that includes naphtha as its main ingredient and dissolves wax, a heater 8 for heating the airtight container 107, a heater 108 for heating the organic solvent vapor 106, and a high-pressure vapor generator 110 for generating the organic solvent vapor having a pressure higher than atmospheric pressure.

A description is given of the fabricating method using the above-described apparatus.

Initially, as illustrated in FIG. 7(a), a GaAs substrate 2 to which a glass plate 1 is adhered with wax is set in the upper cassette 4 so that the surface of the substrate 2 is parallel to the vertical direction. Then, the GaAs substrate 2 with the glass plate 1 is immersed in the organic solvent vapor 106 that is contained in the airtight container 107, heated to about 100° C. with the heaters 8 and 108, and pressurized to a pressure higher than atmospheric pressure. The wax connecting the GaAs substrate 2 and the glass plate 1 is softened and dissolved in the organic solvent vapor 106. When a stress of the GaAs substrate itself or a stress that makes the GaAs substrate 2 curve, which is caused by stresses of insulating films, metal films, and thin semiconductor films as constituents of a semiconductor device on the GaAs substrate, overcomes the remaining adhesion of the wax, the GaAs substrate 2 is separated from the glass plate, dropped by gravity, and received by the substrate cassette 5, as shown in FIG. 7(b). The upper cassette 4 supporting the glass plate 1 has an opening at the lower part, and the GaAs substrate 2 is dropped through the opening and received by the substrate cassette 5. The wax adhered to the GaAs substrate 2 is dissolved in the organic solvent vapor and removed from the substrate.

In the above-described method, when the wax is dissolved and melted in the heated organic solvent vapor 106, the GaAs substrate 2 is separated from the glass plate 1, dropped from the upper cassette 4 by gravity, and received by the substrate cassette 5. Since this process does not include separating the GaAs substrate from the glass plate by applying a force directly to the GaAs substrate with tweezers as in the prior art method, no force is applied to the GaAs substrate perpendicular to the surface of the substrate, whereby unwanted damage of the GaAs substrate, such as cracking, is avoided. Simultaneously, the wax attached to the GaAs substrate is completely removed from the substrate.

Although the surface of the GaAs substrate 2 set in the upper cassette 4 is maintained parallel to the vertical direction, it may be maintained in any direction except the horizontal direction. Also in this case, the GaAs substrate 2 is separated from the glass plate 1 and dropped toward the substrate cassette 5 by gravity.

[Embodiment 8]

Figure 8:
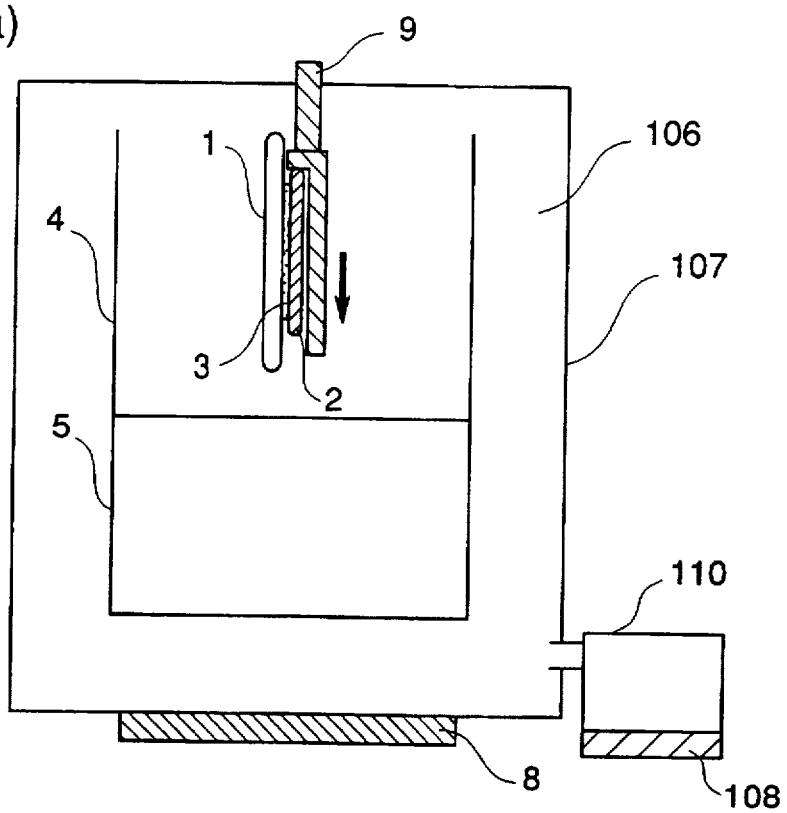
FIGS. 8(a)–8(b) are schematic diagrams illustrating a method and an apparatus for fabricating a semiconductor device in accordance with an eighth embodiment of the present invention.
Figure 8:
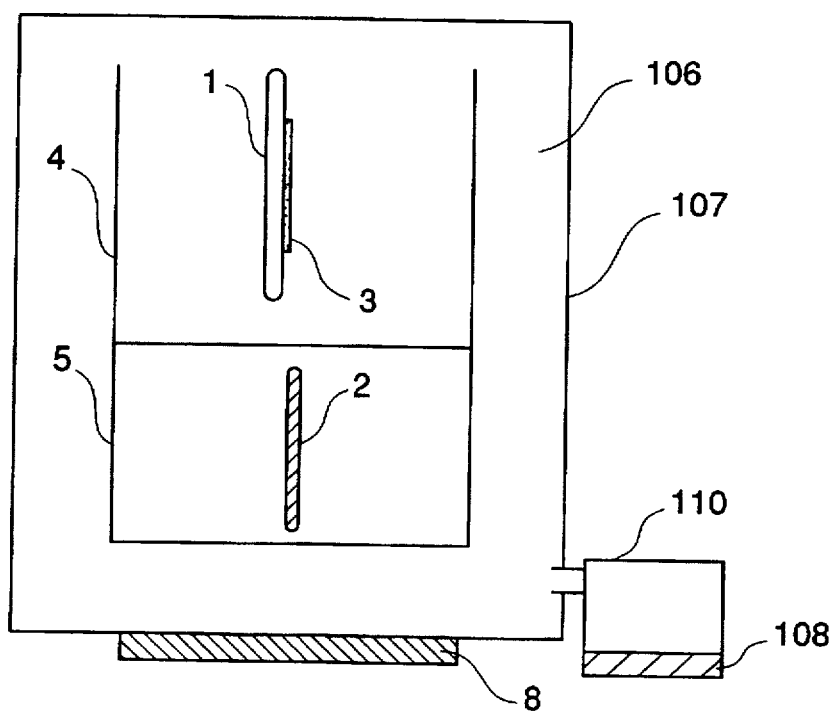

FIGS. 8(a) and 8(b) are schematic diagrams for explaining a method and an apparatus for fabricating a semiconductor device in accordance with an eighth embodiment of the present invention. In these figures, the same reference numerals as those in FIGS. 2(a)–2(b) and 7(a)–7(b) designate the same or corresponding parts.

The apparatus according to this eighth embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, an airtight container 107 containing a gaseous organic solvent (organic solvent vapor) 106 that includes naphtha as its main ingredient and dissolves wax, a heater 8 for heating the airtight container 107, a heater 108 for heating the organic solvent vapor 106, a high-pressure vapor generator 110 for generating the organic solvent vapor having a pressure higher than atmospheric pressure, and a sliding jig 9 for sliding the GaAs substrate 2 downward.

A description is given of the fabricating method using the above-described apparatus.

Initially, a GaAs substrate 2 to which a glass plate 1 is adhered with wax 3 is set in the upper cassette 4 so that the surface of the substrate is parallel to the vertical direction. Then, the GaAs substrate 2 with the glass plate 1 is exposed to the organic solvent vapor 106 that is contained in the airtight container 107, heated to about 100° C. with the heater 8 and the heater 108, and pressurized to a pressure higher than atmospheric pressure. When the wax 3 is softened to some extent, a downward force is applied to the GaAs substrate 2 using the sliding jig 9 as shown in FIG. 2(a), thereby to slide the GaAs substrate 2 downward. The sliding direction is parallel to the surface of the GaAs substrate 2. In this way, the GaAs substrate 2 is separated from the glass plate 1, dropped by gravity, and received by the substrate cassette 5 as shown in FIG. 7(b). During the processing, the wax attached to the GaAs substrate 2 is dissolved in the organic solvent vapor 106 and completely removed from the substrate.

In the above-described method, it is not necessary to expose the GaAs substrate 2 with the glass plate 1 to the organic solvent vapor 106 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the GaAs substrate 2 is separated from the glass plate 1 by forcibly sliding the GaAs substrate 2 downward using the sliding jig 9. Since the GaAs substrate 2 slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is completely removed from the substrate. Further, since the GaAs substrate 2 is forcibly moved, the time required for the separation of the GaAs substrate 2 from the glass plate 1 is reduced compared with the method according to the seventh embodiment.

Although the surface of the GaAs substrate 2 set in the upper cassette 4 is maintained parallel to the vertical direction, it may be maintained in any direction. That is, even when the surface of the GaAs substrate 2 is not in the vertical direction, it is possible to drop the GaAs substrate 2 toward the substrate cassette 5 by gravity after sliding the substrate along the surface thereof using the sliding jig 9.

[Embodiment 9]

Figure 9:
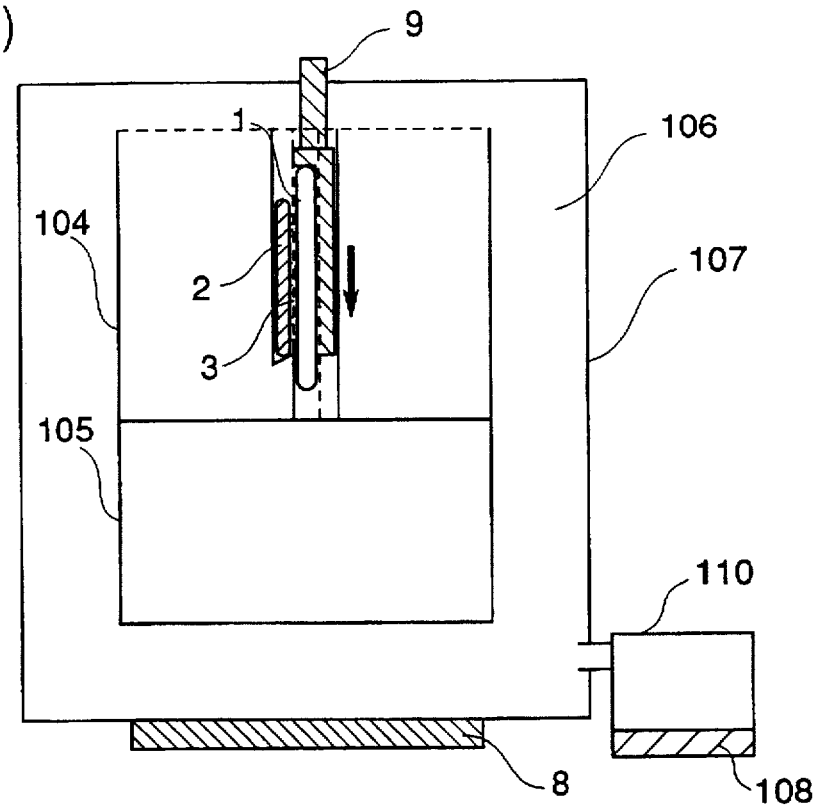
FIGS. 9(a)–9(b) are schematic diagrams illustrating a method and an apparatus for fabricating a semiconductor device in accordance with a ninth embodiment of the present invention.
Figure 9:
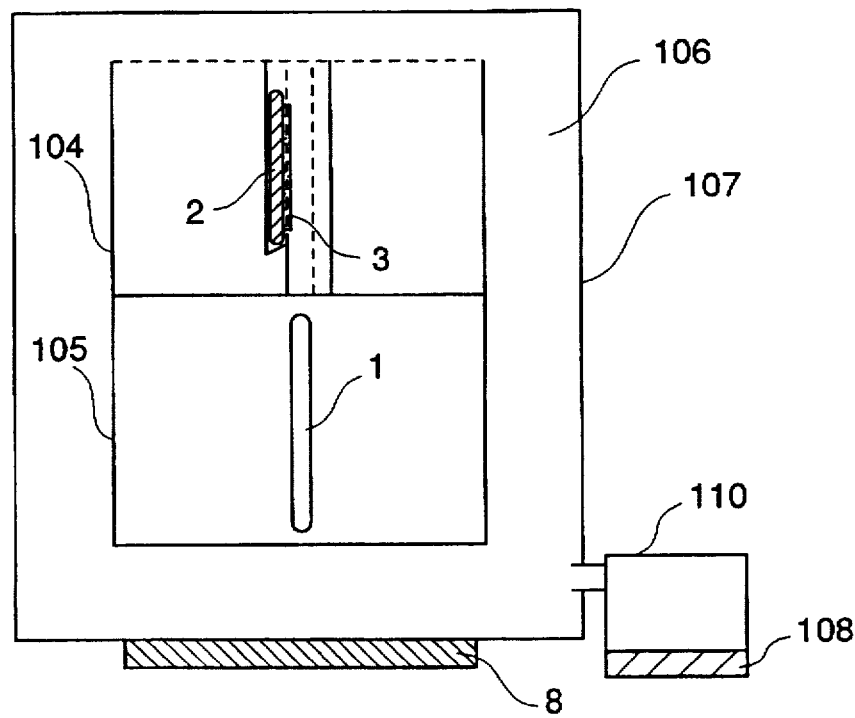

FIGS. 9(a) and 9(b) are schematic diagrams for explaining a method and an apparatus for fabricating a semiconductor device in accordance with a ninth embodiment of the present invention. In these figures, the same reference numerals as those in FIGS. 3(a)–3(d) and 7(a)–7(b) designate the same or corresponding parts.

The apparatus according to this ninth embodiment comprises an upper cassette 104 for holding a GaAs substrate 2 with a glass plate 1 by supporting the GaAs substrate 2, a lower cassette 105 for receiving the glass plate 1 and disposed directly under the upper cassette 104, an airtight container 107 containing a gaseous organic solvent (organic solvent vapor) 106 that includes naphtha as its main ingredient and dissolves wax, a heater 8 for heating the airtight container 107, a heater 108 for heating the organic solvent vapor 106, a high-pressure vapor generator 110 for generating the organic solvent vapor having a pressure higher than atmospheric pressure, and a sliding jig 9 for sliding the glass plate 1 downward. The structure of the substrate supporting upper cassette 104 is the same as that described in the third embodiment.

A description is given of the fabricating method using the above-described apparatus.

Initially, a GaAs substrate 2 to which a glass plate 1 is adhered with wax 3 is set in the upper cassette 104 so that the GaAs substrate 2 is disposed on the inclined portion of the cassette 104 and the surface of the substrate is parallel to the vertical direction. Then, the GaAs substrate 2 with the glass plate 1 is exposed to the organic solvent vapor 106 that is contained in the airtight container 107, heated to about 100° C. with the heater 8, and pressurized to a pressure higher than atmospheric pressure. When the wax 3 is softened to some extent, a downward force is applied to the glass plate 1 using the sliding jig 9 as shown in FIG. 9(a), thereby to slide the glass plate 1 downward. The sliding direction is parallel to the surface of the GaAs substrate 2. In this way, the glass plate 1 is separated from the GaAs substrate 2, dropped by gravity through the lower opening of the upper cassette 104, and received by the lower cassette 105 as shown in FIG. 9(b). During the processing, the wax attached to the GaAs substrate 2 is dissolved in the organic solvent vapor 106 and completely removed from the substrate.

In the above-described method, it is not necessary to expose the GaAs substrate 2 with the glass plate 1 in the organic solvent vapor 106 until the stress of the GaAs substrate itself or the stress that makes the GaAs substrate 2 curve, which is caused by stresses of insulating films, metal films, and thin semiconductor films as constituents of a semiconductor device on the GaAs substrate, overcomes the remaining adhesion of the wax. Even when the wax still has a considerable adhesion, the glass plate 1 is separated from the GaAs substrate 2 by forcibly sliding the glass plate 1 downward using the sliding jig 9. Since the glass plate 1 slides along the junction surface between the GaAs substrate 2 and the glass plate 1, no force is applied to the GaAs substrate 2 in the direction perpendicular to the surface of the GaAs substrate 2, so that unwanted damage of the GaAs substrate 2, such as cracking, is avoided. In addition, the wax attached to the GaAs substrate 2 is dissolved in the organic solvent vapor 106 and completely removed from the substrate. Further, since the glass plate 1 is forcibly moved, the time required for the separation of the GaAs substrate 2 from the glass plate 1 is reduced compared with the method according to the seventh embodiment.

Although the surface of the GaAs substrate 2 set in the upper cassette 104 is maintained parallel to the vertical direction, it may be maintained in any direction. That is, even when the surface of the GaAs substrate 2 is not in the vertical direction, it is possible to drop the glass plate 1 toward the lower cassette 105 by gravity after sliding the glass plate along the surface of the GaAs substrate using the sliding jig 9.

[Embodiment 10]

Figure 10:
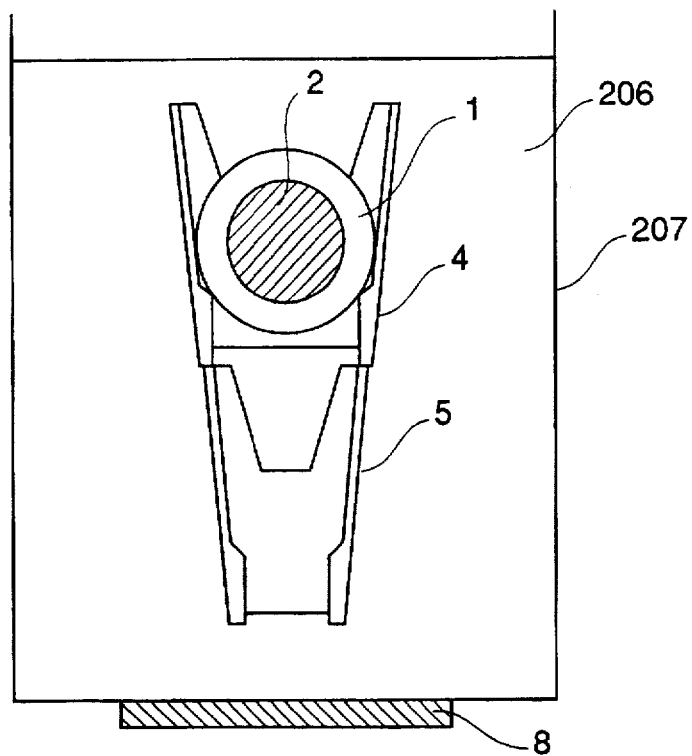
FIGS. 10(a)–10(b) are schematic diagrams illustrating a method and an apparatus for fabricating a semiconductor device in accordance with a tenth embodiment of the present invention.
Figure 10:
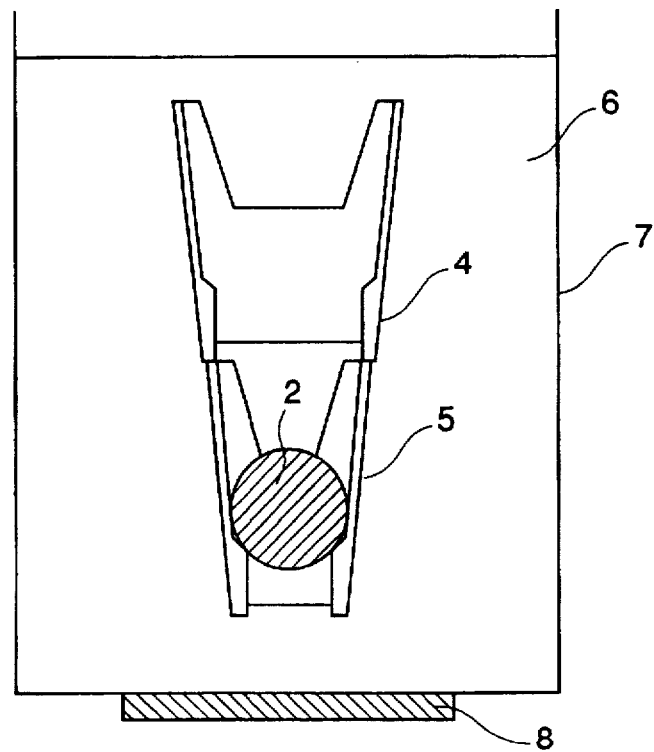

FIGS. 10(a) and 10(b) are schematic diagrams for explaining a method and an apparatus for fabricating a semiconductor device in accordance with a tenth embodiment of the present invention. In these figures, the same reference numerals as those in FIGS. 1(a) and 1(b) designate the same or corresponding parts.

The apparatus according to this tenth embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, a container 207 containing aqueous hydrofluoric acid 206 that dissolves the glass plate 1, a container 7 containing an organic solvent 6 that dissolves wax, and heaters 8 for heating the containers 7 and 207.

A description is given of the fabricating method using the above-described apparatus.

Initially, as illustrated in FIG. 10(a), a GaAs substrate 2 to which a glass plate 1 is adhered with wax is set in the upper cassette 4 so that the surface of the substrate 2 is parallel to the vertical direction. Then, the GaAs substrate 2 with the glass plate 1 is immersed in the hydrofluoric acid 206 that is contained in the container 207 and heated by the heater 8. The glass plate 1 is dissolved in the hydrofluoric acid 206. When the diameter of the glass plate 1 becomes smaller than a minimum diameter required for the glass plate to be supported by the upper cassette 4, the GaAs substrate 2 is dropped by gravity and received by the substrate cassette 5. The upper cassette 4 has an opening at the lower part, and the GaAs substrate 2 is dropped through the opening and received by the substrate cassette 5. The GaAs substrate 2 is immersed in the hydrofluoric acid 206 until the glass plate 1 is completely dissolved. When the glass plate 1 is completely dissolved, the cassettes 4 and 5 and the GaAs substrate 2 stored in the cassette 5 are taken out of the container 207, washed with water, and immersed in the organic solvent 6 that is contained in the container 7 and heated with the heater 8. In the organic solvent 6, the wax attached to the GaAs substrate 2 is dissolved and removed from the substrate.

In the above-described method, the glass plate 1 is dissolved and removed from the GaAs substrate 2 in the heated hydrofluoric acid 206. Therefore, the GaAs substrate 2 is dropped from the upper cassette 4 by gravity and received by the substrate cassette 5. Since this process does not include separating the GaAs substrate from the glass plate by applying a force directly to the GaAs substrate with tweezers as in the prior art method, no force is applied to the GaAs substrate perpendicular to the surface of the substrate, whereby unwanted damage of the GaAs substrate, such as cracking, is avoided. Further, since the GaAs substrate 2 after the removal of the glass plate 1 is immersed in the heated organic solvent 6, the wax remaining on the surface of the GaAs substrate 2 is dissolved and completely removed from the substrate.

Although the surface of the GaAs substrate 2 set in the upper cassette 4 is maintained parallel to the vertical direction, it may be maintained in any direction. That is, even when the surface of the GaAs substrate 2 is not in the vertical direction, it is possible to drop the GaAs substrate 2 toward the substrate cassette 5 by gravity after dissolving the glass plate 1 in the hydrofluoric acid 206.

[Embodiment 11]

Figure 11:
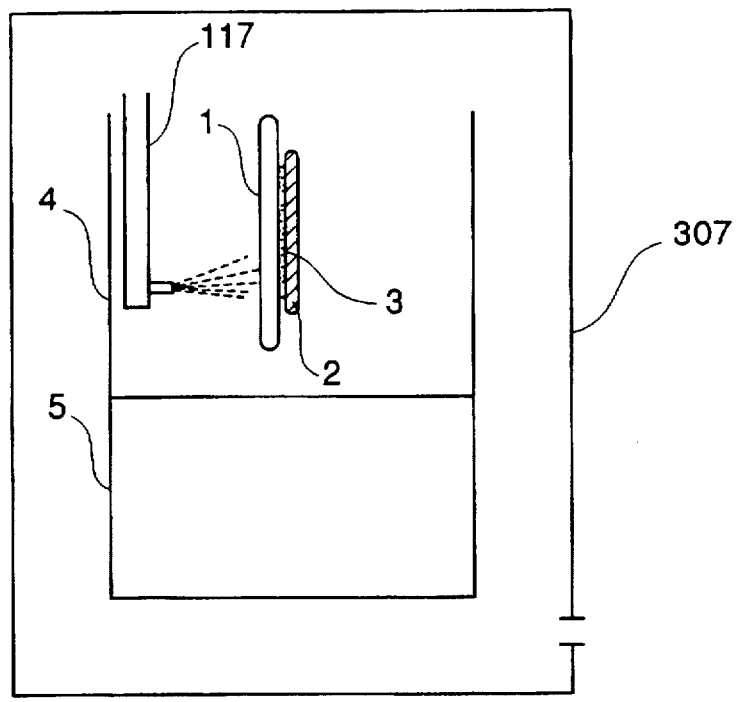
FIGS. 11(a)–11(b) are schematic diagrams illustrating a method and an apparatus for fabricating a semiconductor device in accordance with an eleventh embodiment of the present invention.
Figure 11:
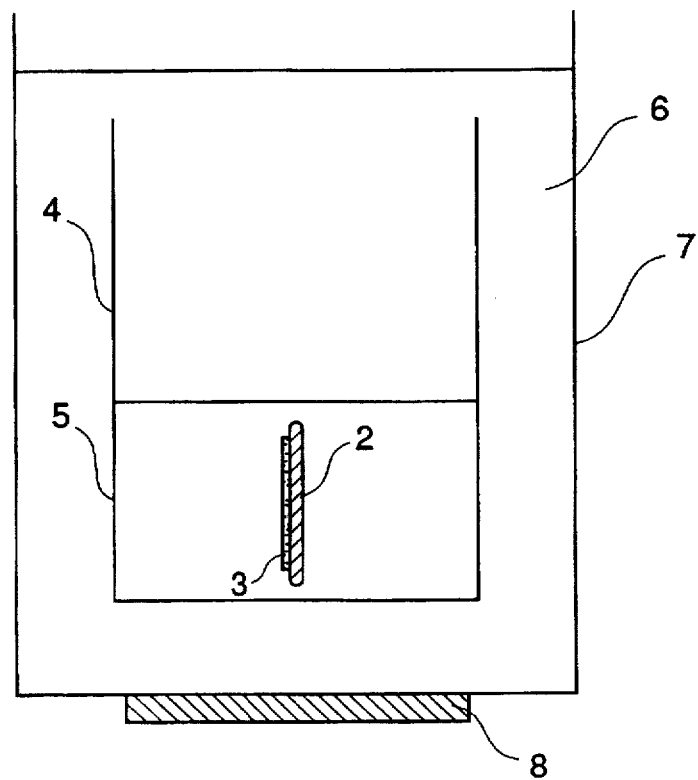

FIGS. 11(a) and 11(b) are schematic diagrams for explaining a method and an apparatus for fabricating a semiconductor device in accordance with an eleventh embodiment of the present invention. In these figures the same reference numerals as those shown in FIGS. 1(a) and 1(b) designate the same or corresponding parts.

The apparatus according to this eleventh embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, a container 7 containing an organic solvent 6 that dissolves wax 3, a heater 8 for heating the container 7, a nozzle for blowing hydrofluoric acid vapor that dissolves the glass plate 1, and a container 307 for the hydrofluoric acid vapor.

A description is given of the fabricating process using the above-described apparatus.

Initially, as illustrated in FIG. 11(a), a GaAs substrate 2 to which a glass plate 1 is adhered with wax 3 is set in the upper cassette 4 so that the surface of the substrate 2 is parallel to the vertical direction. Then, hydrofluoric acid vapor is blown toward the glass plate 1 using the nozzle 117. When the glass plate 1 is dissolved by the hydrofluoric acid vapor and the diameter of the glass plate 1 becomes smaller than a minimum diameter required for the glass plate to be supported by the upper cassette 4, the GaAs substrate 2 is dropped by gravity and received by the substrate cassette 5. The upper cassette 4 has an opening at the lower part, and the GaAs substrate 2 is dropped through the opening and received by the substrate cassette 5. The blowing of the hydrofluoric acid vapor is continued until the glass plate 1 is completely dissolved. Thereafter, the cassettes 4 and 5 and the GaAs substrate 2 stored in the cassette 5 are taken out of the container 307, washed with water, and immersed in the organic solvent 6 that is contained in the container 7 and heated with the heater 8 (FIG. 11(b)). In the organic solvent 6, the wax attached to the GaAs substrate 2 is dissolved and removed from the substrate.

In the above-described method, the glass plate 1 is dissolved and removed from the GaAs substrate 2 by blowing the hydrofluoric acid vapor toward the glass plate. Therefore, the GaAs substrate 2 is dropped from the upper cassette 4 by gravity and received by the substrate cassette 5. Since this process does not include separating the GaAs substrate from the glass plate by applying a force directly to the GaAs substrate with tweezers as in the prior art method, no force is applied to the GaAs substrate perpendicular to the surface of the substrate, whereby unwanted damage of the GaAs substrate, such as cracking, is avoided. Further, since the GaAs substrate 2 after the removal of the glass plate 1 is immersed in the heated organic solvent 6, the wax remaining on the surface of the GaAs substrate 2 is dissolved and completely removed from the substrate.

Although the surface of the GaAs substrate 2 set in the upper cassette 4 is maintained parallel to the vertical direction, it may be maintained in any direction. That is, even when the surface of the GaAs substrate 2 is not in the vertical direction, it is possible to drop the GaAs substrate 2 toward the substrate cassette 5 by gravity after dissolving the glass plate 1 using the hydrofluoric acid vapor.

[Embodiment 12]

Figure 12:
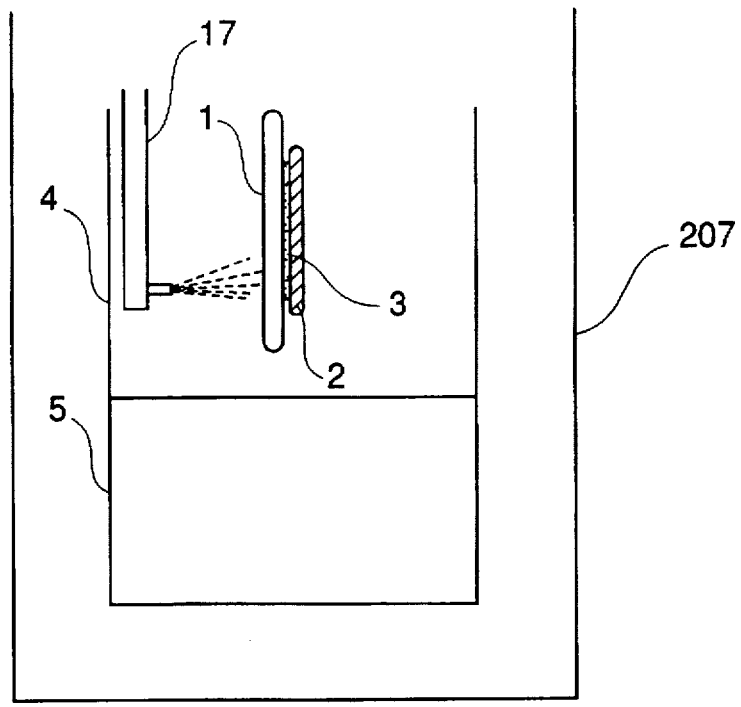
FIGS. 12(a)–12(b) are schematic diagrams illustrating a method and an apparatus for fabricating a semiconductor device in accordance with a twelfth embodiment of the present invention.
Figure 12:
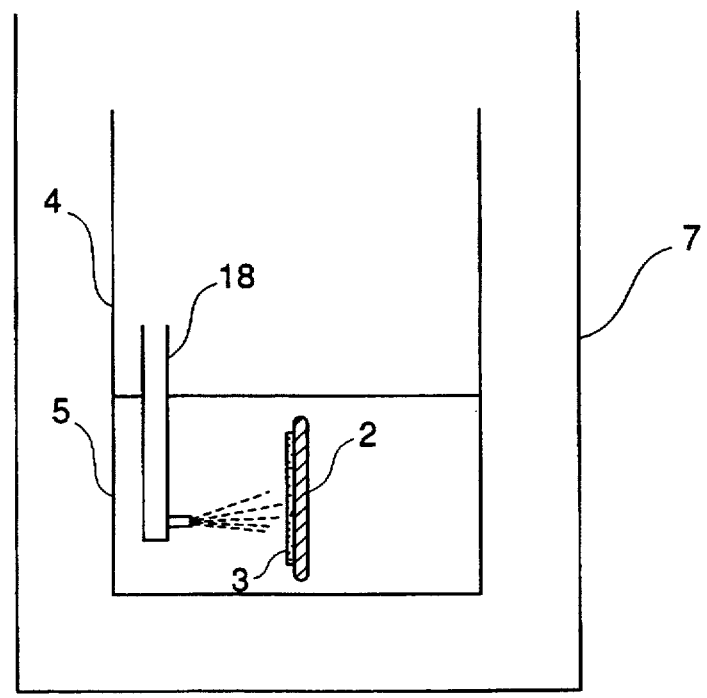

FIGS. 12(a) and 12(b) are schematic diagrams for explaining a method and an apparatus for fabricating a semiconductor device in accordance with a twelfth embodiment of the present invention. In these figures, the same reference numerals as those shown in FIGS. 1(a) and 1(b) designate the same or corresponding parts.

The apparatus according to this twelfth embodiment comprises an upper cassette 4 for holding a GaAs substrate 2 with a glass plate 1 by supporting the glass plate 1, a substrate cassette 5 for receiving the GaAs substrate 2 and disposed directly under the upper cassette 4, a nozzle 17 for spraying aqueous hydrofluoric acid that dissolves the glass plate 1, a container 207 for receiving the hydrofluoric acid, a nozzle 18 for spraying liquid organic solvent that dissolves wax 3, and a container 7 for receiving the organic solvent.

A description is given of the fabricating process using the above-described apparatus.

Initially, as illustrated in FIG. 12(a), a GaAs substrate 2 to which a glass plate 1 is adhered with wax 3 is set in the upper cassette 104 so that the surface of the substrate is parallel to the vertical direction. Then, aqueous hydrofluoric acid is sprayed toward the glass plate 1 using the nozzle 17. When the glass plate 1 is dissolved by the hydrofluoric acid and the diameter of the glass plate 1 becomes smaller than a minimum diameter required for the glass plate to be supported by the upper cassette 4, the GaAs substrate 2 is dropped by gravity and received by the substrate cassette 5. The upper cassette 4 has an opening at the lower part, and the GaAs substrate 2 is dropped through the opening and received by the substrate cassette 5. The spraying of the hydrofluoric acid is continued until the glass plate 1 is completely dissolved. After washing the GaAs substrate 2 with water, the substrate cassette 5 holding the GaAs substrate 2 is put in the container 7, and liquid organic solvent is sprayed toward the wax 3 remaining on the surface of the GaAs substrate 2 using the nozzle 18 (FIG. 12(b)). The wax 3 is dissolved by the organic solvent and completely removed from the substrate.

In the above-described method, the glass plate 1 is dissolved and removed from the GaAs substrate 2 by spraying the aqueous hydrofluoric acid toward the glass plate. Therefore, the GaAs substrate 2 is dropped from the upper cassette 4 by gravity and received by the substrate cassette 5. Since this process does not include separating the GaAs substrate from the glass plate by applying a force directly to the GaAs substrate with tweezers as in the prior art method, no force is applied to the GaAs substrate perpendicular to the surface of the substrate, whereby unwanted damage of the GaAs substrate, such as cracking, is avoided. Further, since the organic solvent is sprayed toward the wax remaining on the surface of the GaAs substrate 2 after the removal of the glass plate 1, the wax is dissolved and completely removed from the substrate.

Although the surface of the GaAs substrate 2 set in the upper cassette 4 is maintained parallel to the vertical direction, it may be maintained in any direction. That is, even when the surface of the GaAs substrate 2 is not in the vertical direction, it is possible to drop the GaAs substrate 2 toward the substrate cassette 5 by gravity after dissolving the glass plate 1 by the aqueous hydrofluoric acid.

[Embodiment 13]

Figure 13:
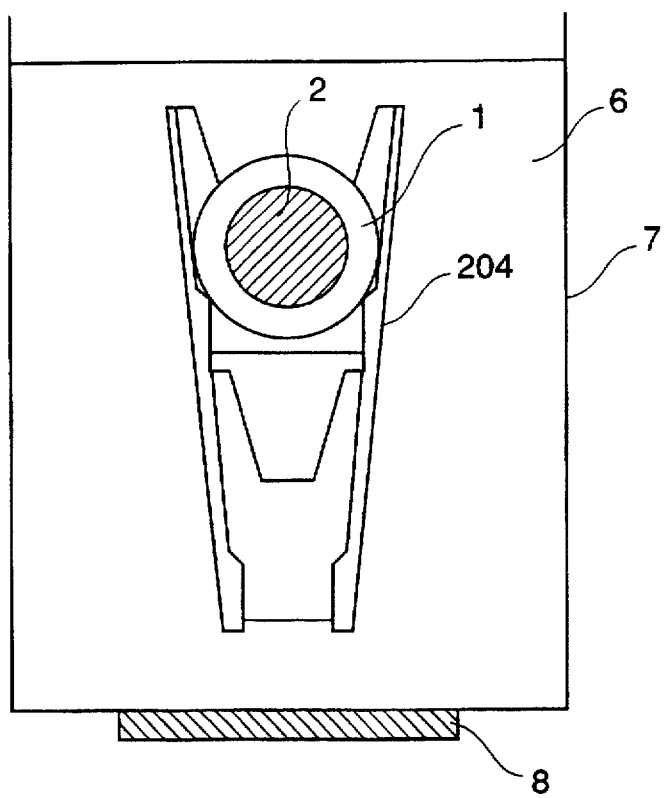
FIGS. 13(a)–13(b) are schematic diagrams illustrating an apparatus for fabricating a semiconductor device in accordance with a thirteenth embodiment of the present invention.
Figure 13:
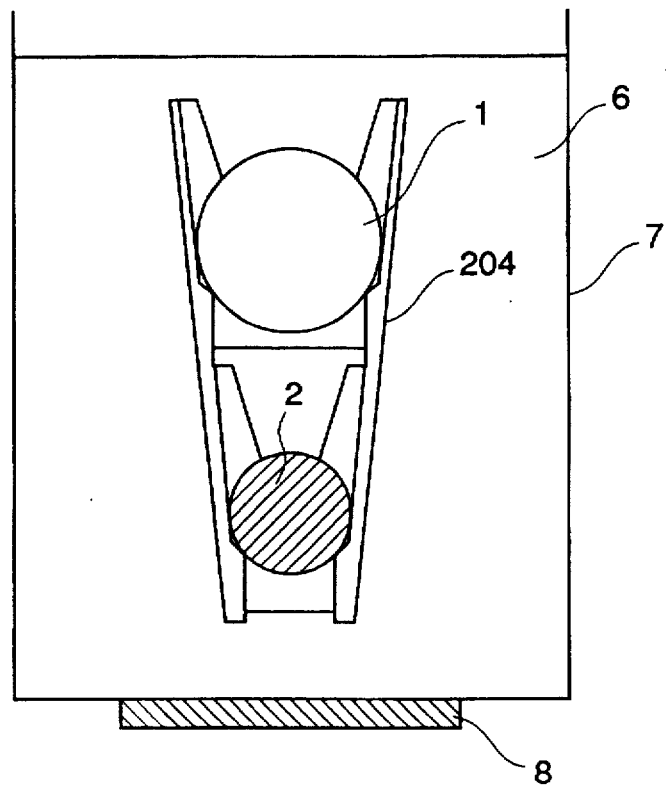

FIGS. 13(a) and 13(b) are schematic diagrams illustrating an apparatus for fabricating a semiconductor device in accordance with a thirteenth embodiment of the present invention. In this thirteenth embodiment, in the first, second, fourth, fifth, seventh, eighth, tenth, eleventh, and twelfth embodiments, the upper cassette 4 for supporting the glass plate and the substrate cassette 5 are united in one body. In the figures, reference numeral 204 shows the united cassette. The fundamental structure of the apparatus according to this thirteenth embodiment is identical to the structure according to the first embodiment of the invention.

Using the apparatus including the united cassette 204, the same fabricating method as described in the first embodiment is realized. More specifically, as illustrated in FIG. 13(a), a GaAs substrate 2 to which a glass plate 1 is adhered with wax is set in an upper part of the cassette 204, which part corresponds to the glass plate supporting upper cassette 4. Then, the cassette 204 is immersed in the heated organic solvent 6 to dissolve the wax between the glass plate 1 and the GaAs substrate 2, whereby the GaAs substrate 2 is separated from the glass plate 1. The separated GaAs substrate 2 is dropped by gravity and received by a lower part of the cassette 204, which part corresponds to the substrate cassette 5. The wax remaining on the surface of the GaAs substrate 2 is dissolved by the organic solvent 6 and completely removed from the substrate.

In this thirteenth embodiment, since the upper cassette for holding the GaAs substrate with the glass plate and the lower cassette for receiving the GaAs substrate separated from the glass plate are united in one body, handling of the cassette is facilitated. Further, since the relative positions of the upper cassette and the lower cassette are fixed, the GaAs substrate separated from the glass plate is received by the lower cassette with high reliability.

Also in the third, sixth, and ninth embodiments of the present invention, the upper cassette 104 that holds the GaAs substrate with the glass plate by supporting the GaAs substrate and the lower cassette 105 that receives the glass plate separated from the GaAs substrate may be united in one body. Also in this case, handling of the cassette is facilitated. Further, since the relative positions of the upper cassette and the lower cassette are fixed, the glass plate separated from the GaAs substrate is received by the lower cassette with high reliability.

The cassette 204 according to this thirteenth embodiment may be employed in any of the fabricating methods according to the first to twelfth embodiments of the present invention.

[Embodiment 14]

Figure 14:
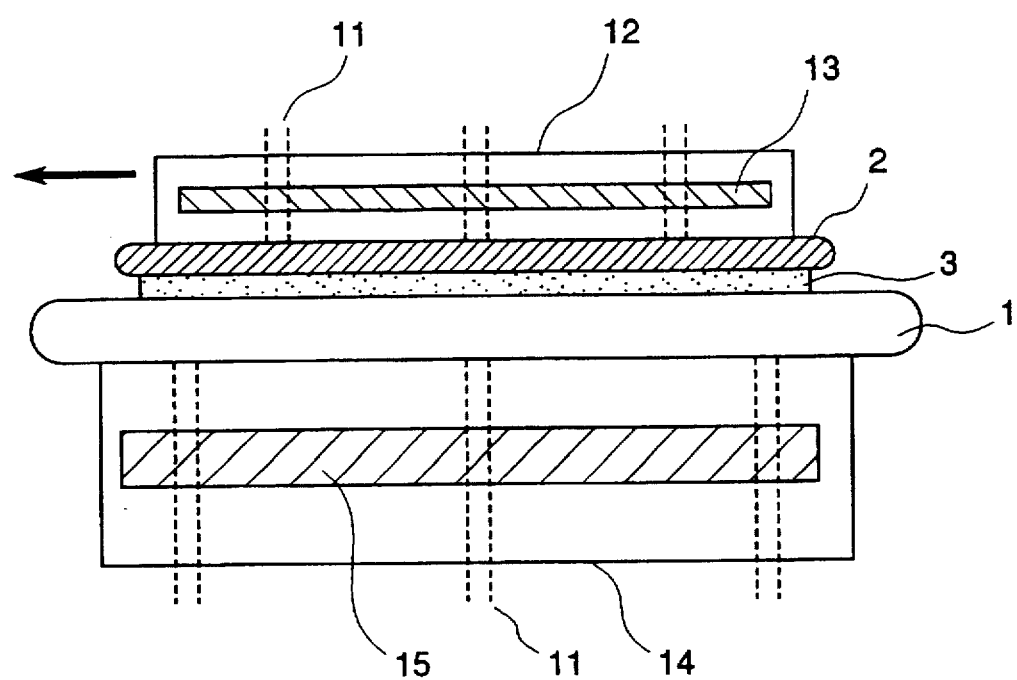
FIG. 14 is a sectional view illustrating a method and an apparatus for fabricating a semiconductor device in accordance with a fourteenth embodiment of the present invention.

FIG. 14 is a diagram for explaining a method and an apparatus for fabricating a semiconductor device in accordance with a fourteenth embodiment of the present invention. In the FIG., a glass plate 1 is adhered to a GaAs substrate 2 with wax 3. The apparatus comprises an upper vacuum stage 12 having vacuum holes 11 and an upper heater 13 and a lower vacuum stage 14 having vacuum holes 11 and a lower heater 15. One (or both) of the vacuum stages 12 and 14 is movable in a direction parallel to the surface of the stage.

A description is given of the fabricating method using the above-described apparatus.

Initially, a GaAs substrate 2 to which a glass plate 1 is adhered with wax 3 is prepared, and the upper vacuum stage 12 and the lower vacuum stage 14 are applied to the GaAs substrate 2 and the glass plate 1, respectively. The GaAs substrate 2 and the glass plate 1 are attracted to the upper stage 12 and the lower stage 14, respectively, by evacuating air through the holes 11. The GaAs substrate 2 and the glass plate 1 are heated by the upper heater 13 and the lower heater 15, respectively. When the heat is transmitted to the wax 3 and the temperature of the wax 3 exceeds 100° C., the wax 3 is melted. Then, the upper stage 12 is moved from the lower stage 14, parallel to the surface of the GaAs substrate 2, as shown by an arrow in FIG. 14. Thereby, the GaAs substrate 2 is separated from the glass plate 1. The upper stage 12 may be moved in any direction parallel to the surface of the GaAs substrate 2. Alternatively, the lower stage 14 may be moved relative to the upper stage 12, or both the upper and lower stages 12 and 14 may be moved in different directions.

In the above-described method, the GaAs substrate 2 and the glass plate 1 are fixed to the upper vacuum stage 12 and the lower vacuum stage 14, respectively, and heated to melt the wax 3 between them. Thereafter, the upper stage 12 is moved parallel to the surface of the GaAs substrate 2 to separate the GaAs substrate 2 from the glass plate 1. Therefore, no force is applied to the GaAs substrate 2 in the direction perpendicular to the surface of the GaAs substrate 2, whereby unwanted damage of the GaAs substrate, such as cracking, is avoided.

Figure 15:
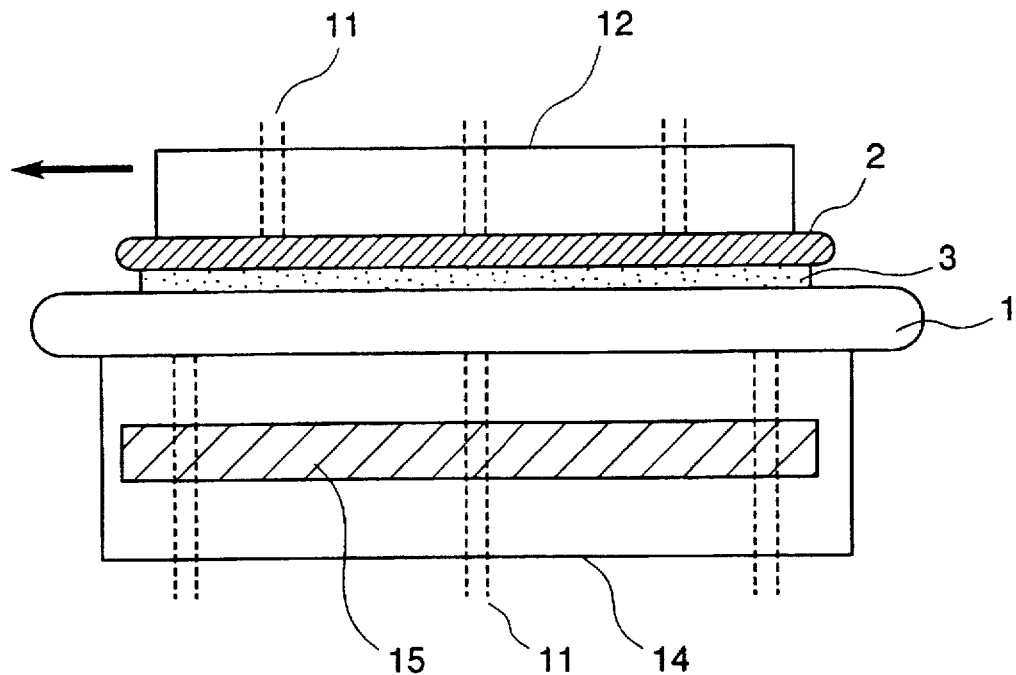
FIG. 15 is a sectional view illustrating a method and an apparatus for fabricating a semiconductor device in accordance with a modification of the fourteenth embodiment of the present invention.
Figure 16:
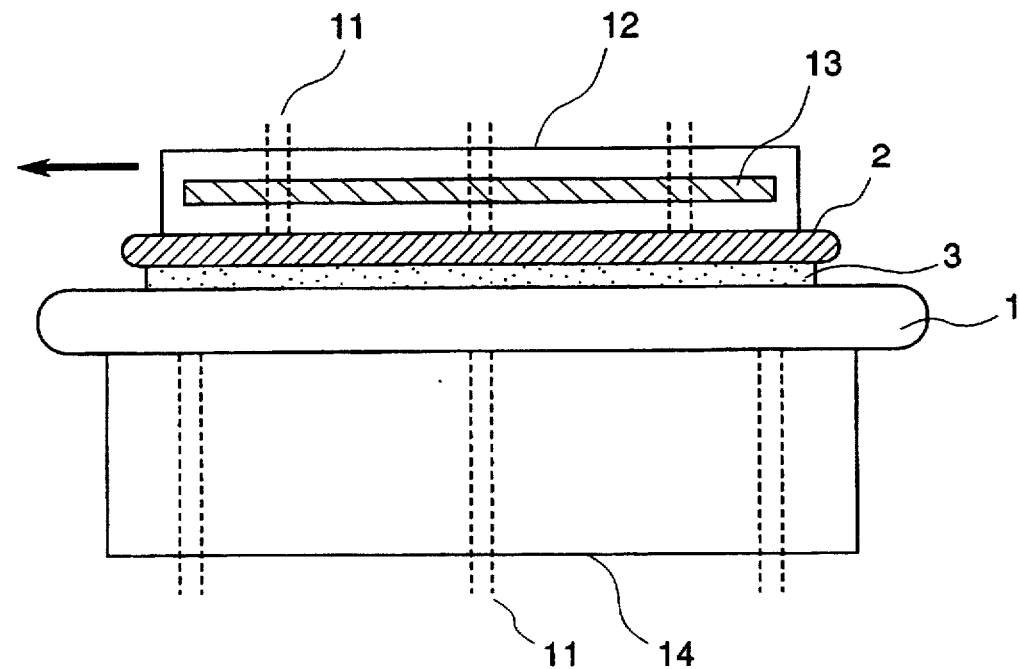
FIG. 16 is a sectional view illustrating a method and an apparatus for fabricating a semiconductor device in accordance with another modification of the fourteenth embodiment of the present invention.

It is not always necessary to provide the heater in both the upper and lower stages. The same effects as described above are achieved even when only the lower stage 14 has the heater 15 (FIG. 15) or only the upper stage 12 has the heater 13 (FIG. 16).

[Embodiment 15]

Figure 17:
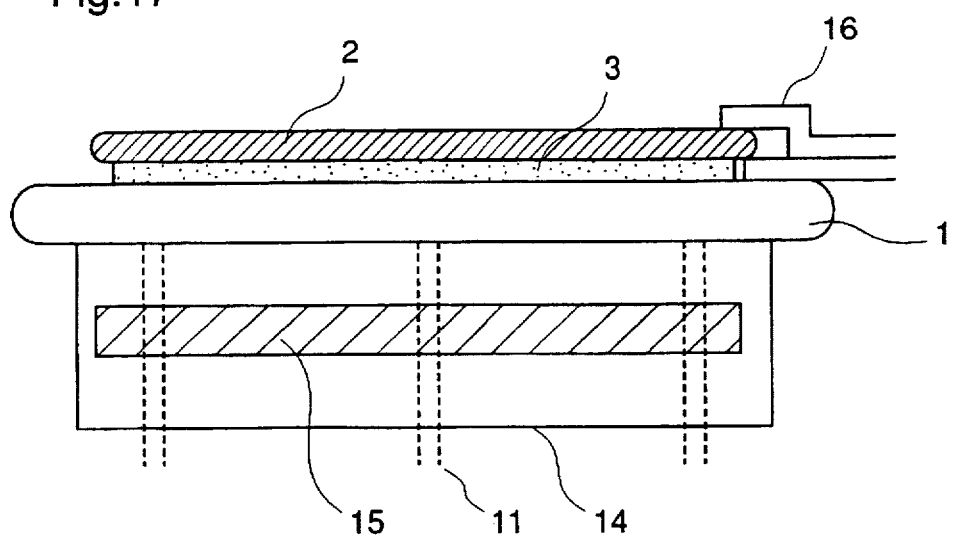
FIG. 17 is a sectional view illustrating a method and an apparatus for fabricating a semiconductor device in accordance with a fifteenth embodiment of the present invention.
Figure 18:
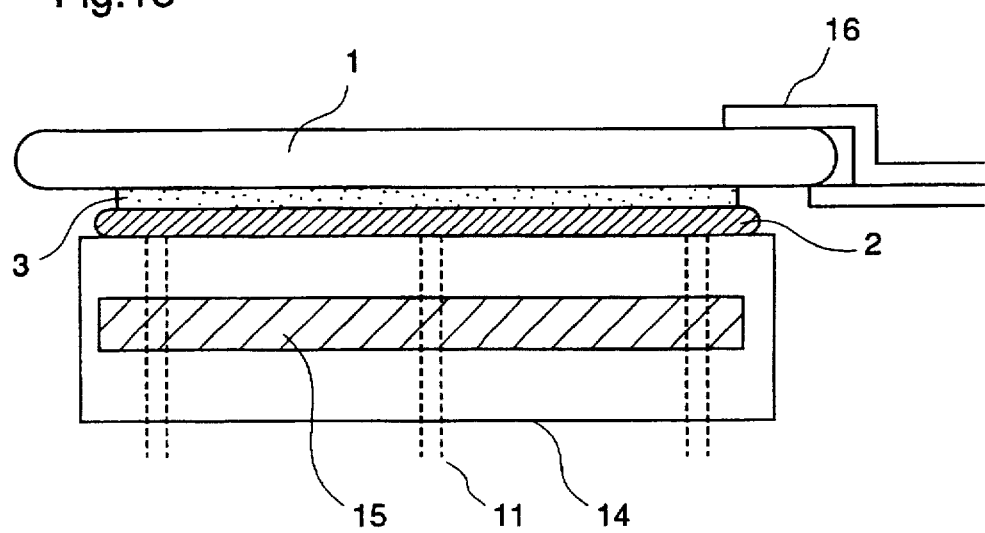
FIG. 18 is a sectional view illustrating a method and an apparatus for fabricating a semiconductor device in accordance with a modification of the fifteenth embodiment of the present invention.

FIG. 17 is a diagram for explaining a method and an apparatus for fabricating a semiconductor device in accordance with a fifteenth embodiment of the present invention. In the figure, the same reference numerals as those in FIG. 14 designate the same or corresponding parts.

The apparatus according to this fifteenth embodiment comprises a lower vacuum stage 14 having vacuum holes 11 and a heater 15 and a sliding jig 16 having a tweezers-shaped tip.

A description is given of the fabricating method using the above-described apparatus.

Initially, a glass plate 1 to which a GaAs substrate 2 is adhered with wax 3 is prepared, and the lower vacuum stage 14 is applied to a surface of the glass plate 1 on the opposite side from the GaAs substrate 2. The glass plate 1 is attracted to the lower stage 14 by evacuating air through the holes 11. The glass plate 1 is heated by the heater 15. When the heat is transmitted to the wax 3 and the temperature of the wax 3 exceeds 100° C., the wax 3 is melted. Then, an edge of the GaAs substrate 2 is held with the tweezers-shaped tip of the sliding jig 16, and the GaAs substrate 2 is moved from the lower vacuum stage 14 parallel to the surface of the GaAs substrate 2, whereby the GaAs substrate 2 is separated from the glass plate 1.

In the above-described method, the glass plate 1 is fixed to the lower vacuum stage 14 and heated to melt the wax 3 and, thereafter, the GaAs substrate 2 is moved from the lower vacuum stage 14 parallel to the surface of the GaAs substrate to separate the GaAs substrate 2 from the glass plate 1. Therefore, no force is applied to the GaAs substrate 2 in the direction perpendicular to the surface of the GaAs substrate 2, whereby unwanted damage of the GaAs substrate, such as cracking, is avoided. In addition, since the tip of the sliding jig 16 is shaped like tweezers, the tip of the sliding jig holds the GaAs substrate 2 with high reliability, whereby the separation of the GaAs substrate 2 from the glass plate 1 is performed with high stability.

Although in this fifteenth embodiment the glass plate 1 is fixed to the lower vacuum stage 14, the same effects as described above are achieved even when the GaAs substrate is fixed to and heated by the lower vacuum stage 14 and the glass plate 1 is moved using the jig 16.

Figure 19:
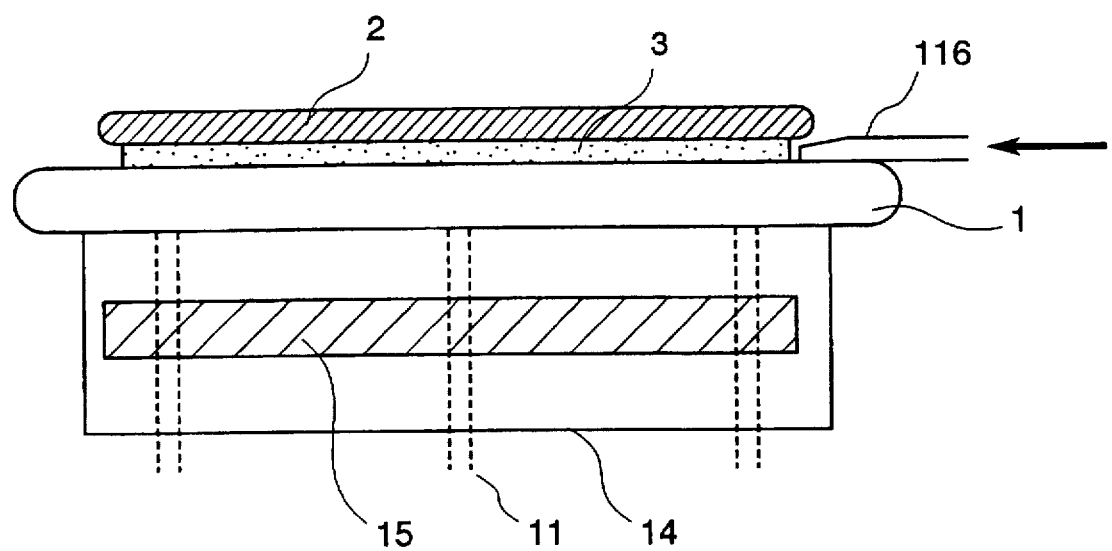
FIG. 19(a) is a sectional view illustrating a method and an apparatus for fabricating a semiconductor device in accordance with another modification of the fifteenth embodiment of the present invention.
FIG. 19(b) is a plan view of a sliding spatulate jig included in the apparatus.
Figure 19:
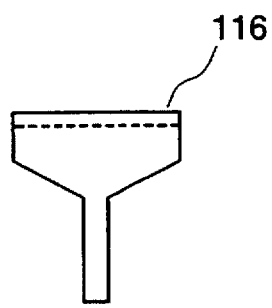
Figure 20:
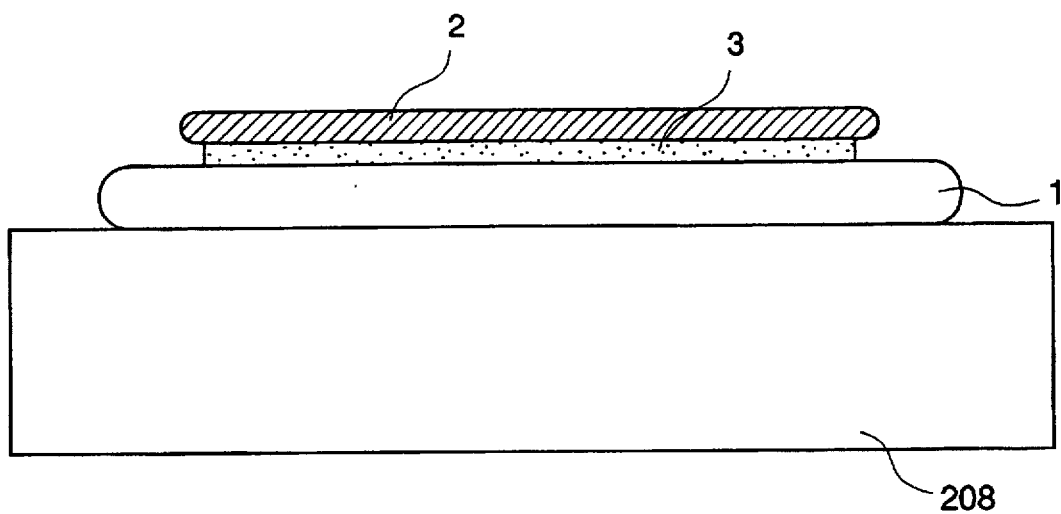
FIG. 20 is a sectional view illustrating a method of fabricating a semiconductor device according to the prior art.

The shape of the sliding jig 16 is not restricted to the tweezers shape. For example, it may be shaped like a spatula as shown in FIG. 19(b). FIG. 19(a) is a sectional view illustrating an apparatus for fabricating a semiconductor device including a sliding spatulate jig 116, and FIG. 19(b) is a plan view of the sliding spatulate jig 116. When the GaAs substrate 2 is moved using the spatulate jig 116, since a force that increases the space between the GaAs substrate 2 and the glass plate 1 is produced at the tip of the jig 116, the time required for the separation of the GaAs substrate 2 from the glass plate 1 is reduced. Also in this case, the GaAs substrate 2 may be fixed to and heated by the lower vacuum stage 14 and the glass plate 1 may be moved using the spatulate jig 116.

What is claimed is:

1. A method of fabricating a semiconductor device including:

preparing a semiconductor substrate having a surface;

adhering a reinforcing plate to the surface of the semiconductor substrate with an adhesive and processing the semiconductor substrate;

holding the semiconductor substrate with the reinforcing plate with a holder, the holder supporting one of the semiconductor substrate and the reinforcing plate in a non-horizontal direction;

immersing the semiconductor substrate with the reinforcing plate held by the holder in a heated solvent, melting and dissolving the adhesive; and applying a relative force parallel to the surface of the semiconductor substrate to one of the reinforcing plate and the semiconductor substrate, separating the semiconductor substrate from the reinforcing plate without applying a force transverse to the surface of the semiconductor substrate, the one of the semiconductor substrate and the reinforcing plate not supported by the holder dropping by gravity towards a cassette located under the holder in the solvent.

2. An apparatus for fabricating a semiconductor device comprising:

a holder for holding a semiconductor substrate adhered with an adhesive to a reinforcing plate and supporting one of the semiconductor substrate and the reinforcing plate in a non-horizontal direction;

means for applying a relative force parallel to the surface of the semiconductor substrate to one of the semiconductor substrate and the reinforcing plate with the reinforcing plate held by the holder, separating the semiconductor substrate from the reinforcing plate without applying a force transverse to the surface of the semiconductor substrate, the one of the semiconductor substrate and the reinforcing plate not supported by the holder dropping by gravity;

a cassette disposed under the holder for receiving the one of the semiconductor substrate and the reinforcing plate dropping by gravity;

a container for receiving the holder and for containing a liquid solvent that dissolves the adhesive; and a heater for heating the liquid solvent.

3. The apparatus of claim 2 comprising said holder supporting the semiconductor substrate.

4. The apparatus of claim 3 including a pressurizer for pressurizing the solvent to a pressure higher than atmospheric pressure.

5. The apparatus of claim 2 comprising said holder supporting the reinforcing plate.

6. The apparatus of claim 2 including a pressurizer for pressurizing the solvent to a pressure higher than atmospheric pressure.

* * * * *